US012765196B2

(12) United States Patent
Lee et al.

(10) Patent No.: US 12,765,196 B2
(45) Date of Patent: Oct. 13, 2026

(54) DISPLAY DEVICE

(71) Applicant: Samsung Display Co., LTD., Yongin-si (KR)

(72) Inventors: Won Se Lee, Yongin-si (KR); Su Jin Lee, Yongin-si (KR); Dong Hyeon Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 391 days.

(21) Appl. No.: 18/508,823

(22) Filed: Nov. 14, 2023

(65) Prior Publication Data

US 2024/0334766 A1 Oct. 3, 2024

(30) Foreign Application Priority Data

Mar. 27, 2023 (KR) ........................ 10-2023-0040048

(51) Int. Cl.

| | |
|---|---|
| ***H10K 59/131*** | (2023.01) |
| ***G09G 3/3258*** | (2016.01) |
| ***H10K 59/122*** | (2023.01) |
| ***H10K 59/126*** | (2023.01) |

(52) U.S. Cl.

CPC ......... *H10K 59/131* (2023.02); *G09G 3/3258* (2013.01); *H10K 59/122* (2023.02); *H10K 59/126* (2023.02); *G09G 2300/0426* (2013.01)

(58) Field of Classification Search

CPC .. H10K 59/131; H10K 59/122; H10K 59/126; H10K 59/123; H10K 59/1213; H10K 59/124; G09G 3/3258; G09G 2300/0426; H10D 30/6755

USPC ............................................................ 257/40

See application file for complete search history.

(56) References Cited

U.S. PATENT DOCUMENTS

| | | | | |
|---|---|---|---|---|
| 2008/0309232 A1* | 12/2008 | Yamamoto | H10K 59/876 313/505 |
| 2014/0124751 A1* | 5/2014 | Choi | H10K 59/122 438/34 |
| 2016/0210905 A1* | 7/2016 | Lee | H10D 86/60 |
| 2020/0381495 A1* | 12/2020 | Jeon | H10K 59/126 |
| 2022/0189373 A1* | 6/2022 | Bang | H04N 7/144 |

FOREIGN PATENT DOCUMENTS

| | | |
|---|---|---|
| CN | 113674689 B | 8/2022 |
| KR | 10-2020-0126463 A | 11/2020 |
| KR | 10-2022-0022013 A | 2/2022 |
| KR | 10-2384774 B1 | 4/2022 |

* cited by examiner

*Primary Examiner* — Tong-Ho Kim

(74) *Attorney, Agent, or Firm* — Womble Bond Dickinson (US) LLP

(57) ABSTRACT

A display device includes: a substrate; a pixel electrode on the substrate; a bank on the pixel electrode, and defining an emission area; a first transistor connected to the pixel electrode; and a driving electrode connected to the first transistor, and including: a main electrode extended in a direction; and a sub-electrode branching off from the main electrode. At least one of the main electrode or the sub-electrode overlaps with the emission area to divide the emission area into at least two sub-emission areas in a plan view.

19 Claims, 30 Drawing Sheets

DISPLAY DEVICE

CROSS-REFERENCE TO RELATED APPLICATION

The present application claims priority to and the benefit of Korean Patent Application No. 10-2023-0040048, filed on Mar. 27, 2023, in the Korean Intellectual Property Office, the entire disclosure of which is incorporated by reference herein.

BACKGROUND

1. Field

Aspects of embodiments of the present disclosure relate to a display device, and more particularly, to a display device that may improve image quality by way of reducing level differences in an emission area.

2. Description of the Related Art

An organic light-emitting display apparatus includes display elements, for example, such as organic light-emitting diodes, which have varying luminance depending on an electric current.

Such an organic light-emitting diode display apparatus includes a plurality of pixels for providing light of different colors.

SUMMARY

Embodiments of the present disclosure are directed to a display device that may improve image quality.

However, the aspects and features of the present disclosure are not limited to those described above, and the above and other aspects and features of the present disclosure will be more clearly understood by those having ordinary skill in the art from the following description.

According to one or more embodiments of the present disclosure, a display device includes: a substrate; a pixel electrode on the substrate; a bank on the pixel electrode, and defining an emission area; a first transistor connected to the pixel electrode; and a driving electrode connected to the first transistor, and including: a main electrode extended in a direction; and a sub-electrode branching off from the main electrode. At least one of the main electrode or the sub-electrode overlaps with the emission area to divide the emission area into at least two sub-emission areas in a plan view.

In an embodiment, a gap may be located between the main electrode and the sub-electrode to overlap with the emission area.

In an embodiment, an edge of the bank defining the emission area may overlap with the gap.

In an embodiment, the display device may further include a second transistor connected to the first transistor, and including an oxide-based active layer.

In an embodiment, the display device may further include a third transistor connected to the second transistor, and including an oxide-based active layer.

In an embodiment, the sub-electrode may overlap with at least one of the second transistor or the third transistor.

In an embodiment, the display device may further include a data line adjacent to the driving electrode, and located at the same layer as that of the driving electrode.

In an embodiment, the display device may further include a gate connection electrode connected to a gate electrode of the first transistor, and located under the driving electrode.

In an embodiment, the display device may further include an initialization voltage line adjacent to the gate connection electrode, and located at the same layer as that of the gate connection electrode.

In an embodiment, at least a part of the initialization voltage line may be located between the data line and the gate connection electrode in a plan view.

In an embodiment, the gate connection electrode may overlap with the main electrode of the driving electrode.

In an embodiment, the data line may overlap with the emission area.

In an embodiment, the emission area may include a plurality of sub-emission areas divided by at least one of the main electrode or the sub-electrode, and divided by the data line in a plan view.

In an embodiment, the sub-electrode may be parallel to the main electrode.

In an embodiment, a gap may be located between the main electrode and the sub-electrode, and may have a U shape.

In an embodiment, the display device may further include a first driving voltage line connected to the driving electrode.

In an embodiment, the emission area may be located between adjacent transmissive areas.

In an embodiment, the display device may further include an electronic component under the substrate, and overlapping with the emission area and the transmissive areas.

In an embodiment, the display device may further include a light-blocking layer on the substrate, and overlapping with the emission area.

In an embodiment, the light-blocking layer may not overlap with the transmissive areas.

According to one or more embodiments of the present disclosure, a level difference of an insulating film disposed on a driving electrode in an emission area may be reduced, and thus, a level difference of a pixel electrode on the insulating film may also be reduced. As a result, light may be emitted in constant directions and at constant angles from the pixels, and it may be possible to prevent or reduce the white angular dependency phenomenon in which colors on the screen may look different depending on viewing angles and viewing positions of the display device.

According to one or more embodiments of the present disclosure, because an initialization voltage line may be disposed between a data line and a gate connection electrode, it may be possible to prevent or substantially prevent coupling between the gate connection electrode and the data line.

However, the aspects and features of the present disclosure are not limited to those described above, and other aspects and features may be included in the following description of the present disclosure, or may be learned by practicing one or more of the present embodiments of the present disclosure.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
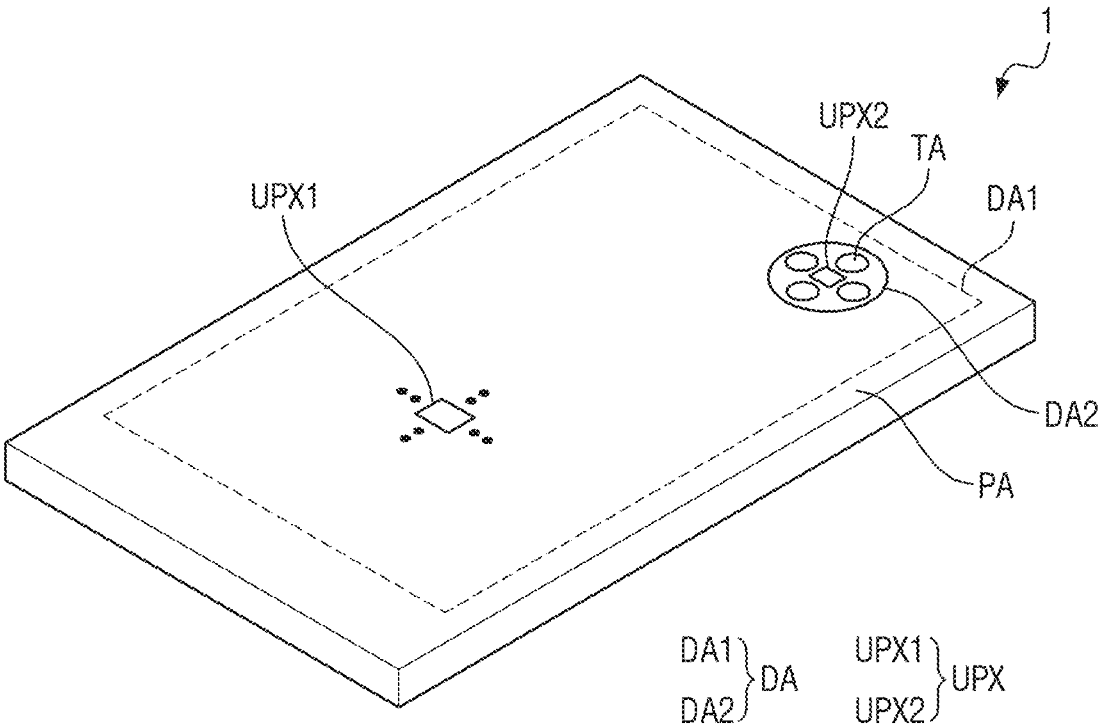
FIG. 1 is a three-dimensional view schematically showing a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a three-dimensional view schematically showing a display device according to an embodiment of the present disclosure.

Referring to FIG. 1, a display device 1 may include a display area DA, and a peripheral area PA adjacent to the display area DA. The display area DA may include a first display area DA1 and a second display area DA2. The display device 1 may provide images through arrays of a plurality of unit pixels UPX arranged in the display area DA. Each unit pixel UPX may include a plurality of sub-pixels (hereinafter referred to as pixels) for providing light of different wavelengths from each other. For example, one unit pixel UPX may include a red pixel for providing light of a red wavelength, a green pixel for providing light of a green wavelength, and a blue pixel for providing light of a blue wavelength.

The plurality of unit pixels UPX may be disposed in the first display area DA1 and the second display area DA2. The array of the plurality of unit pixels UPX disposed in the first display area DA1 may be different from that of the second display area DA2. For example, an array of unit pixels (e.g., a plurality of first unit pixels) UPX1 may be disposed in the first display area, and an array of unit pixels (e.g., a plurality of second unit pixels) UPX2 may be disposed in the second display area. Because transmissive areas TA may be located between the plurality of second unit pixels UPX2 disposed in the second display area DA2, the array of second unit pixels UPX2 in the second display area DA2 may be different from the array of first unit pixels UPX1 in the first display area DA1.

The display device 1 may provide a first image by using light emitted from the unit pixels UPX1 disposed in the first display area DA1, and may provide a second image by using light emitted from the unit pixels UPX2 disposed in the second display area DA2. In some embodiments, the first image and the second image may be parts of the same image provided through the display area DA of the display device 1. As another example, in some embodiments, the display device 1 may provide the first image and the second image that are independent of (e.g., different images from) each other.

The second display area DA2 may include the transmissive areas TA located between the unit pixels UPX2. Incidentally, the pixels of a unit pixel UPX may be arranged between adjacent transmissive areas TA. The transmissive areas TA may transmit light, and thus, no pixel is arranged in the transmissive areas TA.

The peripheral area PA is a non-display area that provides no image, and may entirely or partially surround (e.g., around a periphery of) the display area DA. A driver for providing electrical signals or power to the display area DA and the like may be disposed in the peripheral area PA. Pads may be disposed in the peripheral area PA, so that an electronic device or a printed circuit board may be electrically connected to the pads.

As shown in FIG. 1, the second display area DA2 may have a circular shape or an elliptical shape when viewed from the top (e.g., in a plan view). As another example, the second display area DA2 may have a polygonal shape, such as a rectangle, a bar, and the like.

The second display area DA2 may be located inside the first display area DA1, or on one side of the first display area DA1. As shown in FIG. 1, the second display area DA2 may be entirely surrounded (e.g., around a periphery thereof) by the first display area DA1. In some embodiments, the second display area DA2 may be partially surrounded (e.g., around a periphery thereof) by the first display area DA1. For example, the second display area DA2 may be located at one corner of the first display area DA1, and may be partially surrounded (e.g., around a periphery thereof) by the first display area DA1.

The ratio of the second display area DA2 to the display area DA may be smaller than the ratio of the first display area DA1 to the display area DA. As shown in FIG. 1, the display device 1 may include one second display area DA2, but the present disclosure is not limited thereto, and the display device 1 may include two or more second display areas DA2.

As shown in FIG. 1, the display device 1 may have, but is not limited to, a rectangular shape when viewed from the top (e.g., in a plan view).

The display device 1 may have various suitable shapes, such as a polygon, a polygon with rounded corners, a circle, and an ellipse.

The display device 1 may include (e.g., may be implemented as) a mobile phone, a tablet PC, a laptop computer, a smart watch worn on the wrist, a smart band, an electronic device for a vehicle, and the like.

Figure 2:
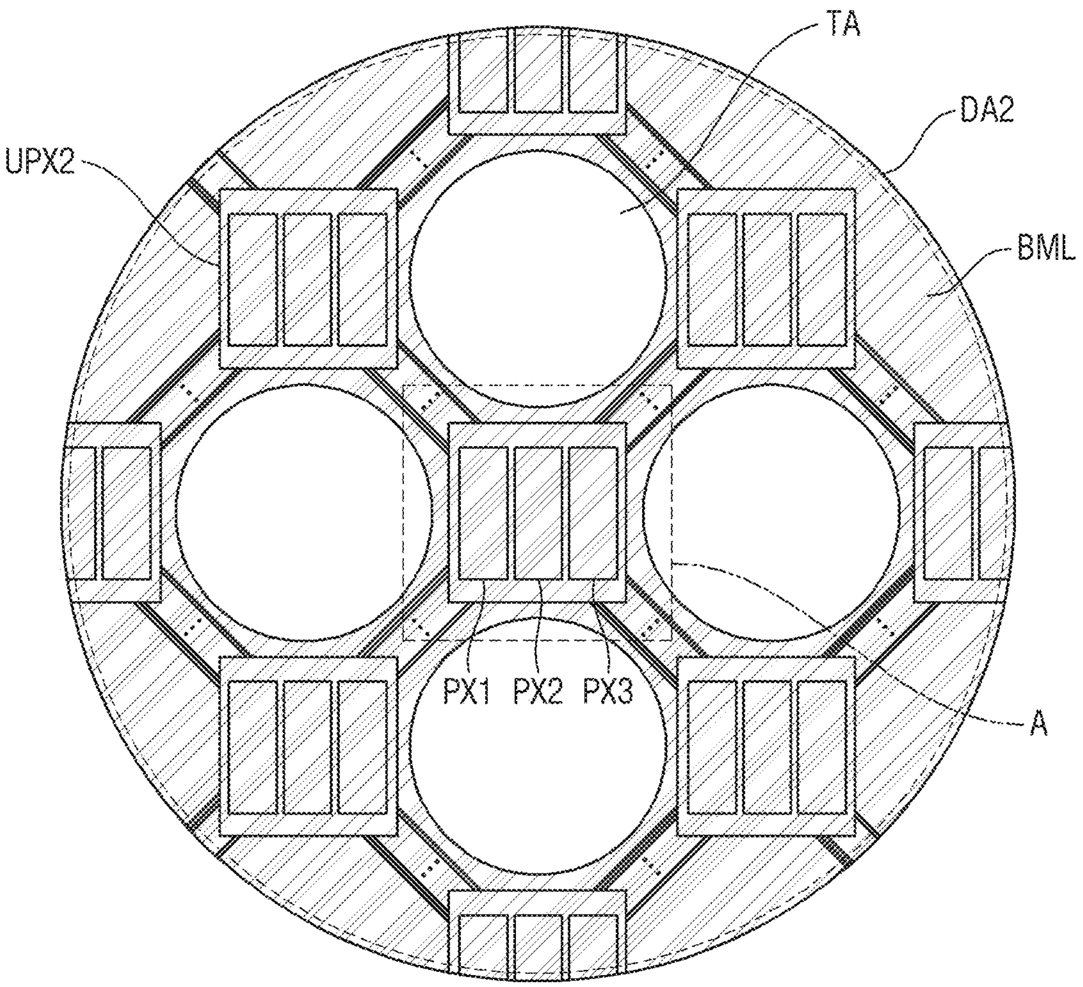
FIG. 2 is an enlarged view of a second display area of FIG. 1.

FIG. 2 is an enlarged view of the second display area DA2 of FIG. 1. For example, FIG. 2 illustrates an enlarged plan view of the second display area DA2.

As shown in FIG. 2, the second display area DA2 may include the plurality of unit pixels UPX2 and the plurality of transmissive areas TA.

The transmissive area TA may be surrounded (e.g., around peripheries thereof) by the plurality of unit pixels UPX2.

At least one of light emitted from an electronic component or light directed toward the electronic component may be transmitted through the transmissive areas TA. The transmittance of the transmissive areas TA may be equal to or greater than approximately 30%, may be equal to or greater than approximately 40%, may be equal to or greater than approximately 50%, may be equal to or greater than approximately 60%, may be equal to or greater than approximately 75%, may be equal to or greater than approximately 80%, may be equal to or greater than approximately 85%, or may be equal to or greater than approximately 90%.

The electronic component may be disposed in the second display area DA2. For example, the electronic component may be disposed under a substrate of the display device 1 in the second display area DA2. The electronic component may be an electronic device using light or sound. The electronic device may be, for example, a sensor for measuring distance, such as a proximity sensor, a sensor for recognizing a part of a user's body (e.g., a fingerprint, an iris, a face, or the like), a small lamp for outputting light, or an image sensor (e.g., a camera) for capturing an image. The electronic device using light may use light in various suitable wavelength bands, such as visible light, infrared light, and ultraviolet light. The electronic device using sound may use ultrasonic waves, or sound in other frequency bands. In some embodiments, the electronic component 20 may include sub-components, such as a light emitter and a light receiver. The light emitter and the light receiver may be integrated as a single piece, or a pair of the light emitter and the light receiver that are physically separated from each other may form a single electronic component.

A single electronic component or a plurality of electronic components may be disposed in the second display area DA2. When the display device 1 includes the plurality of electronic components, the number of second display areas DA2 may be equal to the number of the plurality of electronic components. For example, the display device 1 may include a plurality of second display areas DA2 that are spaced apart from one another. In some embodiments, a plurality of electronic components may be disposed in one second display area DA2. For example, the display device 1 may include a bar-shaped second display area DA2, and the plurality of electronic components may be spaced apart from one another along a length direction of the second display area DA2.

A light-blocking layer BML may be disposed in the second display area DA2, except in the transmissive areas TA.

The plurality of second unit pixels UPX2 may be disposed on the light-blocking layer BML. The plurality of second unit pixels UPX2 may include a first pixel PX1, a second pixel PX2, and a third pixel PX3 for providing light of different wavelengths from each other. For example, the first pixel PX1 may be a blue pixel capable of providing blue light, the second pixel PX2 may be a green pixel capable of providing green light, and the third pixel PX3 may be a red pixel capable of providing red light. The first pixel PX1 may include a first pixel circuit PC1 (e.g., see FIGS. 4A and 4B), and a first light-emitting element connected thereto. The second pixel PX2 may include a second pixel circuit PC2 (e.g., see FIGS. 4A and 4B), and a second light-emitting element connected thereto. The third pixel PX3 may include a third pixel circuit PC3 (e.g., see FIGS. 4A and 4B), and a third light-emitting element connected thereto. The first light-emitting element may provide blue light, the second light-emitting element may provide green light, and the third light-emitting element may provide red light.

Adjacent unit pixels may be connected to each other through signal lines and power lines. The signal lines may include a first gate line, a second gate line, a third gate line, a fourth gate line, and an emission control line EML, which will be described in more detail below. The power lines may include a first driving voltage line VDL, a second driving voltage line, a first initialization voltage line VIL1, a second initialization voltage line, and bias voltage lines VBL, which will be described in more detail below.

Figure 3:
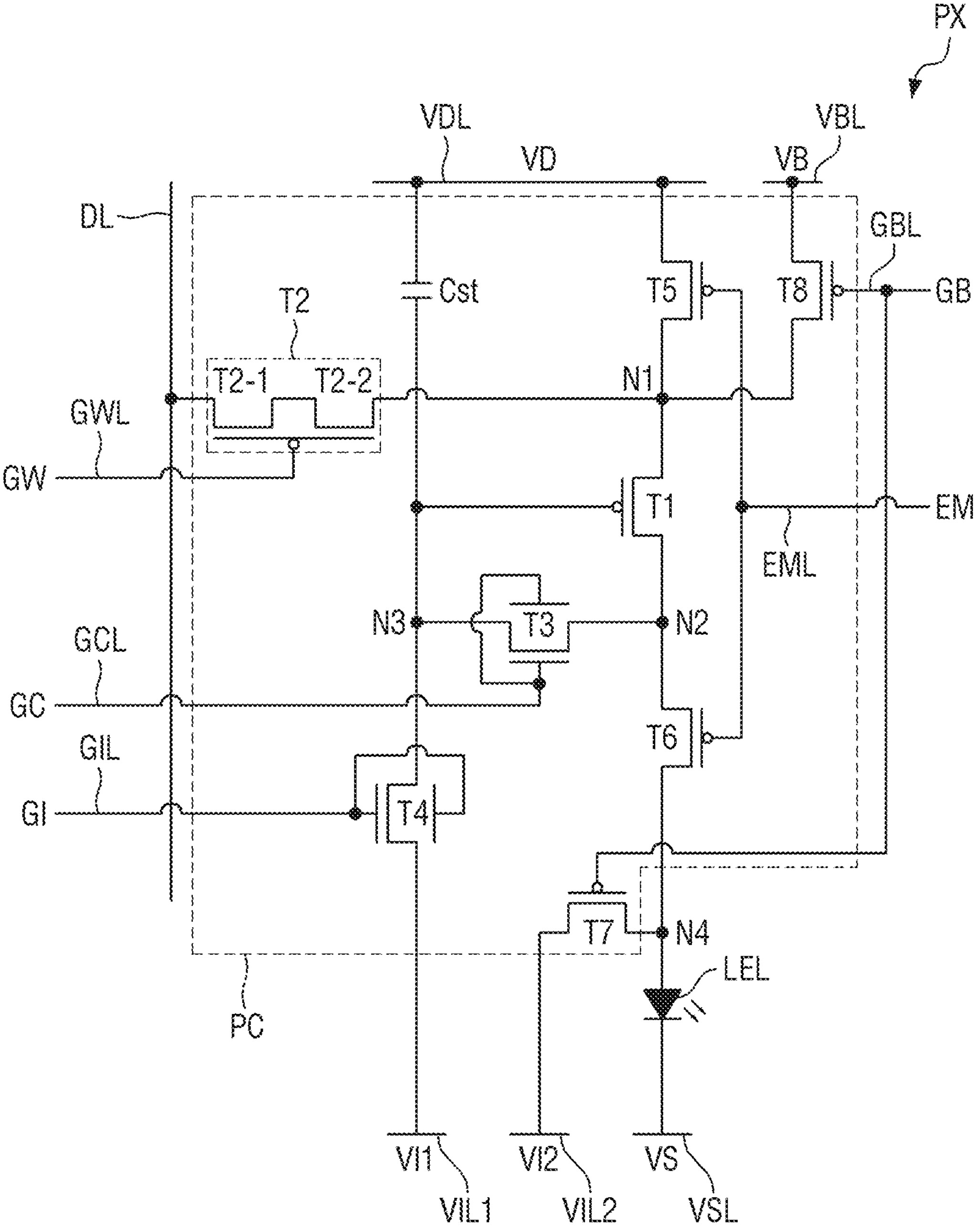
FIG. 3 is a circuit diagram of a pixel of a display device according to an embodiment of the present disclosure.

FIG. 3 is a circuit diagram of a pixel of a display device according to an embodiment of the present disclosure.

A pixel PX may be connected to a first gate line GWL, a second gate line GCL, a third gate line GIL, a fourth gate line GBL, an emission control line EML, a data line DL, a first driving voltage line VDL, a second driving voltage line VSL, a first initialization voltage line VIL1, a second initialization voltage line VIL2, and a bias voltage line VBL.

The pixel (e.g., each of the pixels PX1, PX2, and PX3) may include a pixel circuit PC and a light-emitting element LEL. The pixel circuit PC may include a first transistor T1, a second transistor T2, a third transistor T3, a fourth transistor T4, a fifth transistor T5, a sixth transistor T6, a seventh transistor T7, an eighth transistor T8, and a capacitor Cst.

The first transistor T1 may include a gate electrode, a source electrode, and a drain electrode. The first transistor T1 may control a source-drain current (hereinafter referred to as a driving current) according to a data voltage applied to the gate electrode. The driving current (e.g., Isd) flowing through the channel region of the first transistor T1 may be proportional to the square of a difference between the threshold voltage Vth and the voltage (Vsg) between the source electrode and the gate electrode of the first transistor T1 (e.g., $Isd=k\times(Vsg-Vth)^2$, where k denotes a proportional coefficient determined by the structure and physical properties of the first transistor T1, Vsg denotes the source-gate voltage of the first transistor T1, and Vth denotes the threshold voltage of the first transistor T1).

The light-emitting element LEL may receive the driving current to emit light. The amount or the luminance of the light emitted from the light-emitting element LEL may be proportional to the magnitude of the driving current (e.g., Isd).

The light-emitting element LEL may be an organic light-emitting diode including a first electrode, a second electrode, and an organic light-emitting layer disposed between the first electrode and the second electrode. As another example, the light-emitting element LEL may be an inorganic light-emitting element including a first electrode, a second electrode, and an inorganic semiconductor disposed between the first electrode and the second electrode. As another example, the light-emitting element LEL may be a quantum-dot light-emitting element including a first electrode, a second electrode, and a quantum-dot emissive layer between the first electrode and the second electrode. As another example, the light-emitting element LEL may be a micro light-emitting diode.

The first electrode of the light-emitting element LEL may be electrically connected to a fourth node N4. The first electrode of the light-emitting element LEL may be connected to the drain electrode of the sixth transistor ST6 and the source electrode of the seventh transistor ST7 through the fourth node N4. The second electrode of the light-emitting element LEL may be connected to the second driving voltage line VSL. The second electrode of the light-emitting element LEL may receive a second driving voltage VS (e.g., a low-level voltage) from the second driving voltage line VSL.

The second transistor T2 may be turned on by a first gate signal GW of the first gate line GWL to electrically connect the data line DL with a first node N1, which is the source electrode of the first transistor T1. The second transistor T2 may be turned on in response to the first gate signal GW to apply a data voltage to the first node N1. The gate electrode of the second transistor T2 may be electrically connected to the first gate line GWL, the source electrode thereof may be electrically connected to the data line DL, and the drain electrode thereof may be electrically connected to the first node N1. The second transistor T2 may be a dual gate transistor including a plurality of sub-transistors. For example, the second transistor T2 may include a (2-1) sub-transistor T2-1 (hereinafter referred to as a (2-1) transistor T2-1), and a (2-2) sub-transistor (hereinafter referred to as a (2-2) transistor T2-2). The (2-1) transistor T2-1 and the (2-2) transistor T2-2 may include gate electrodes commonly connected to the first gate line GWL. In other words, the gate electrode of the (2-1) transistor T2-1 and the gate electrode of the (2-2) transistor T2-2 may be integrally formed with each other. The (2-1) transistor T2-1 and the (2-2) transistor T2-2 may be connected between the data line DL and the first node N1.

The third transistor T3 may be turned on by a second gate signal CG of the second gate line GCL, and may electrically connect a second node N2, which is the drain electrode of the first transistor T1, with a third node N3, which is the gate electrode of the first transistor T1. The third transistor T3 may be connected between the third node N3 and the second node N2. For example, the gate electrode of the third transistor T3 may be electrically connected to the second gate line GCL, the source electrode thereof may be electrically connected to the third node N3, and the drain electrode thereof may be electrically connected to the second node N2. The third transistor T3 may be turned on by the second gate signal GC of the second gate line GCL, and may electrically connect the drain electrode of the first transistor T1 with the gate electrode of the first transistor T1, or in other words, may diode-connect the first transistor T1. The third transistor T3 may be a double-gate transistor having two gate electrodes (e.g., a gate electrode and a counter gate electrode). The gate electrode and the counter gate electrode may face each other at (e.g., in or on) different layers from each other.

The fourth transistor T4 may be turned on by a third gate signal GI of the third gate line GIL to electrically connect the third node N3, which is the gate electrode of the first transistor T1, with the first initialization voltage line VIL1. The fourth transistor T4 may be connected in series between the third node N3 and the first initialization voltage line VIL1. For example, the gate electrode of the fourth transistor T4 may be electrically connected to the third gate line GIL, the source electrode thereof may be electrically connected to the third node N3, and the drain electrode thereof may be electrically connected to the first initialization voltage line VIL1. The fourth transistor T4 may be a double-gate transistor. The first initialization voltage line VIL1 may transmit a first initialization voltage VI1.

The fifth transistor T5 may be turned on by an emission control signal EM of the emission control line EML, and may electrically connect the first driving voltage line VDL with the first node N1, which is the source electrode of the first transistor T1. The gate electrode of the fifth transistor T5 may be electrically connected to the emission control line EML, the source electrode thereof may be electrically connected to the first driving voltage line VDL, and the drain electrode thereof may be electrically connected to the first node N1.

The sixth transistor T6 may be turned on by the emission control signal EM of the emission control line EML to electrically connect the second node N2, which is the drain electrode of the first transistor T1, with the fourth node N4, which is the first electrode of the light-emitting element LEL. The gate electrode of the sixth transistor T6 may be electrically connected to the emission control line EML, the source electrode thereof may be electrically connected to the second node N2, and the drain electrode thereof may be electrically connected to the fourth node N4.

When all of the fifth transistor T5, the first transistor T1, and the sixth transistor T6 are turned on, the driving current may be supplied to the light-emitting element LEL.

The seventh transistor T7 may be turned on by a fourth gate signal GB of the fourth gate line GBL to electrically connect the fourth node N4, which is the first electrode of the light-emitting element LEL, with the second initialization voltage line VIL2. As the seventh transistor T7 is turned on based on the fourth gate signal GB, the first electrode of the light-emitting element LEL may be discharged to a second initialization voltage VI2. The gate electrode of the seventh transistor T7 may be electrically connected to the fourth gate line GBL, the source electrode thereof may be electrically connected to the fourth node N4, and the drain electrode thereof may be electrically connected to the second initialization voltage line VIL2. The second initialization voltage line VIL2 may transmit the second initialization voltage VI2.

The eighth transistor T8 may be turned on by the fourth gate signal GB of the fourth gate line GBL to electrically connect the bias voltage line VBL with the first node N1, which is the source electrode of the first transistor T1. The eighth transistor T8 may be turned on based on the fourth gate signal GB to apply the bias voltage VB to the first node N1. The eighth transistor T8 may improve a hysteresis of the first transistor T1 by applying the bias voltage VB to the source electrode of the first transistor T1. The gate electrode of the eighth transistor T8 may be electrically connected to the fourth gate line GBL, the source electrode thereof may be electrically connected to the bias voltage line VBL, and the drain electrode thereof may be electrically connected to the first node N1.

Each of the first transistor T1, the second transistor T2, the fifth transistor T5, the sixth transistor T6, the seventh transistor T7, and the eighth transistor T8 may include a silicon-based active layer. For example, each of the first transistor T1, the second transistor T2, the fifth transistor T5, the sixth transistor T6, the seventh transistor T7, and the eighth transistor T8 may be a p-type transistor including an active layer made of low-temperature polycrystalline silicon (LTPS). The active layer made of low-temperature polycrystalline silicon may have a high electron mobility and excellent turn-on characteristics. Accordingly, as the display device 10 includes transistors having excellent turn-on characteristics, the plurality of pixels PX may be driven stably and efficiently. Each of the first transistor T1, the second transistor T2, the fifth transistor T5, the sixth transistor T6, the seventh transistor T7, and the eighth transistor T8 may output a current introduced from the source electrode thereof via the drain electrode thereof based on a gate-low voltage applied to the gate electrode thereof.

The third transistor T3 and the fourth transistor T4 may be n-type transistors including an oxide-based active layer. A transistor including the oxide-based active layer may have a coplanar structure in which a gate electrode thereof is disposed at the top. A transistor including the oxide-based active layer may output a current introduced into the drain electrode thereof via the source electrode thereof based on a gate-high voltage applied to the gate electrode thereof.

The capacitor Cst may be electrically connected between the third node N3, which is the gate electrode of the first transistor T1, and the first driving voltage line VDL. For example, the first electrode of the capacitor Cst is electrically connected to the third node N3 and the second electrode of the capacitor Cst is electrically connected to the first driving voltage line VDL, so that a potential difference between the first driving voltage line VDL and the gate electrode of the first transistor T1 may be maintained or substantially maintained.

Each of the pixels PX1, PX2, and PX3 described above with reference to FIG. 2 may have the same or substantially the same circuit configuration as that of the pixel PX shown in FIG. 3.

Figure 4A:
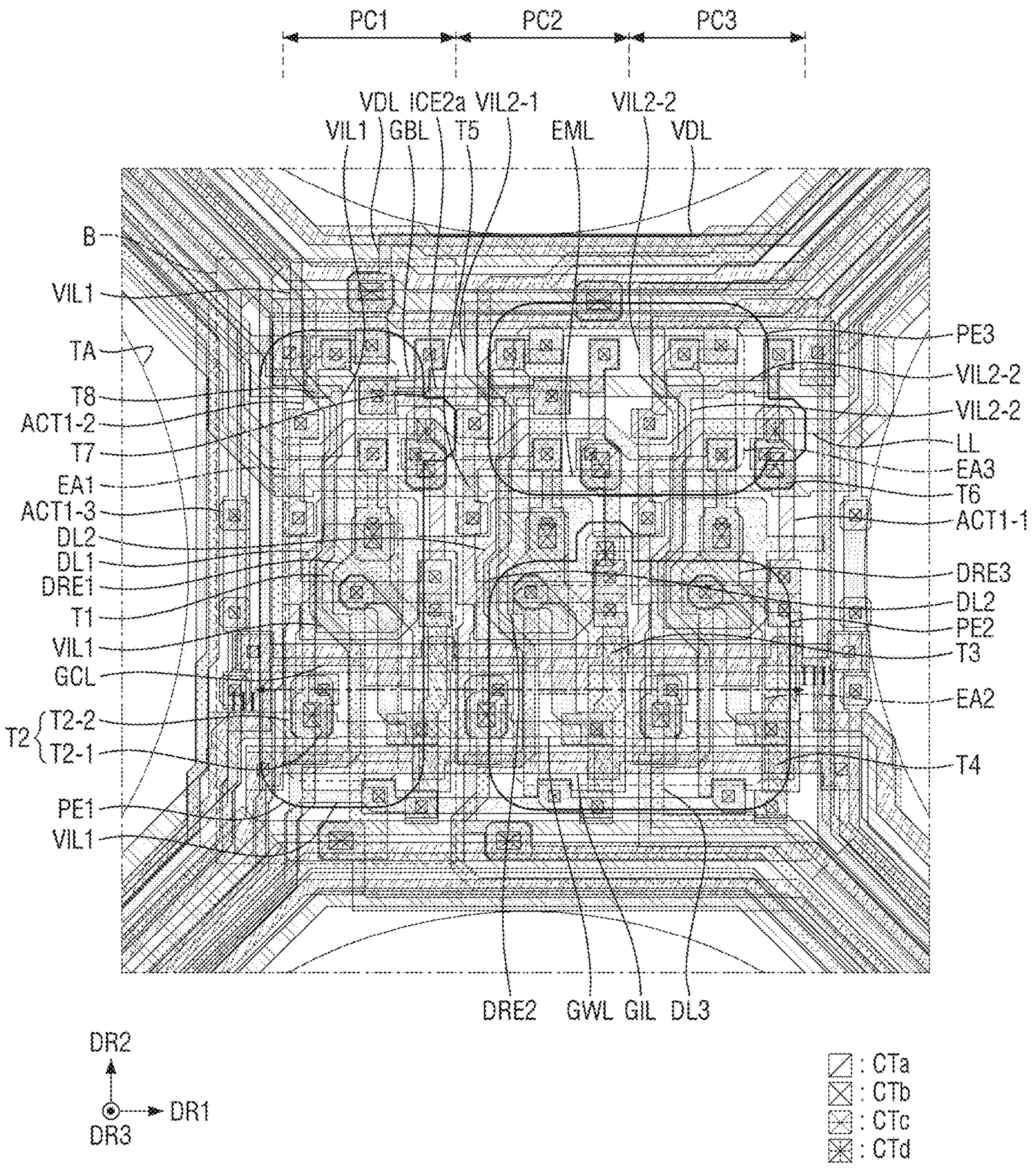
FIGS. 4A and 4B are plan views of a unit pixel array according to an embodiment of the present disclosure.
Figure 4B:
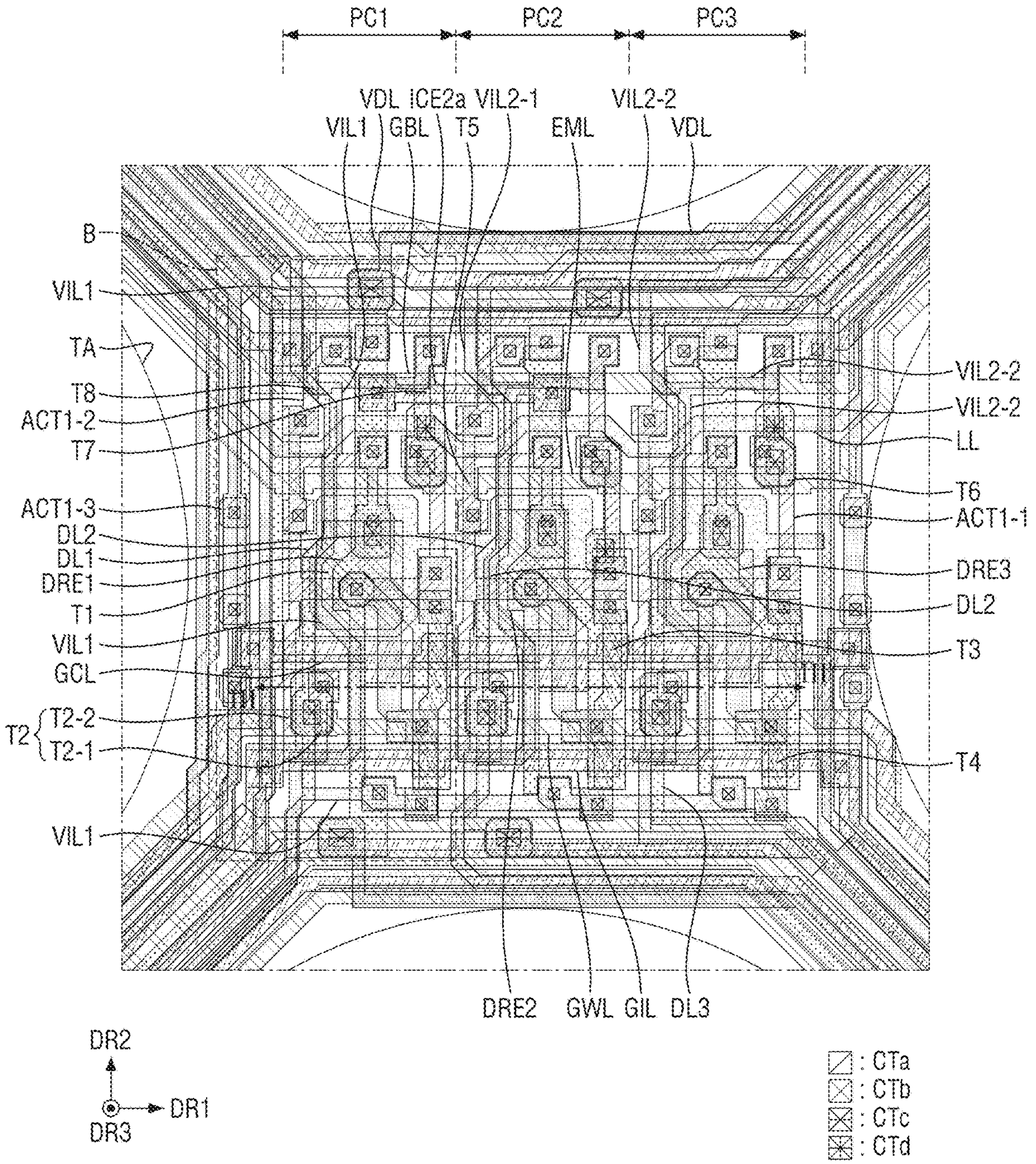

FIGS. 4A and 4B are plan views of a unit pixel array according to an embodiment of the present disclosure. For example, FIGS. 4A and 4B may be enlarged views of the portion A of FIG. 2. In other words, FIGS. 4A and 4B may illustrate one unit pixel array disposed in the second display area DA2.

As described above, one unit pixel UPX2 may include the first pixel PX1, the second pixel PX2, and the third pixel PX3. As shown in FIGS. 4A and 4B, the first pixel PX1 (e.g., a blue pixel) may include a first pixel circuit PC1, and a first pixel electrode PE1 connected thereto. The second pixel PX2 (e.g., a green pixel) may include a second pixel circuit PC2, and a second pixel electrode PE2 connected thereto. The third pixel PX3 (e.g., a red pixel) may include a third pixel circuit PC3, and a third pixel electrode PE3 connected thereto. The first pixel electrode PE1 may be an anode electrode of a first light-emitting element (e.g., a blue light-emitting element). The second pixel electrode PE2 may be an anode electrode of a second light-emitting element (e.g., a green light-emitting element). The third pixel electrode PE3 may be an anode electrode of a third light-emitting element (e.g., a red light-emitting element).

The first pixel circuit PC1 may be connected to the first pixel electrode PE1, a first data line DL1, a first gate line GWL, a second gate line GCL, a third gate line GIL, a fourth gate line GBL, an emission control line EML, a first driving voltage line VDL, a first initialization voltage line VIL1, and a (2-1) initialization voltage line VIL2-1

The second pixel circuit PC2 may be connected to the second pixel electrode PE2, a second data line DL2, the first gate line GWL, the second gate line GCL, the third gate line GIL, the fourth gate line GBL, the emission control line EML, the first driving voltage line VDL, the first initialization voltage line VIL1, and the (2-1) initialization voltage line VIL2-1.

The third pixel circuit PC3 may be connected to the third pixel electrode PE3, a third data line DL3, the first gate line GWL, the second gate line GCL, the third gate line GIL, the fourth gate line GBL, the emission control line EML, the first driving voltage line VDL, the first initialization voltage line VIL1, and the (3-2) initialization voltage line VIL2-2.

The (2-1) initialization voltage line VIL2-1 may be commonly connected to the first pixel circuit PC1 and the second pixel circuit PC2. The (2-2) initialization voltage line VIL2-2 may be connected to the third pixel circuit PC3. The (2-1) initialization voltage of the (2-1) initialization voltage line VIL2-1 and the (2-2) initialization voltage of the (2-2) initialization voltage line VIL2-2 may have different magnitudes from each other.

Each of the pixel circuits PX1, PX2, and PX3 may have the above-described configuration as that of the pixel PX described above with reference to FIG. 3. For example, the first pixel circuit PC1 may include first to eighth transistors T1 to T8, and a capacitor Cst. The second pixel circuit PC2 and the third pixel circuit PC3 may each also include first to eighth transistors T1 to T8, and a capacitor Cst. Because the pixel circuits PX1 to PX3 have the same or substantially the same configuration as each other, the first pixel circuit PC1 will be described in more detail hereinafter as a representative example.

Figure 5:
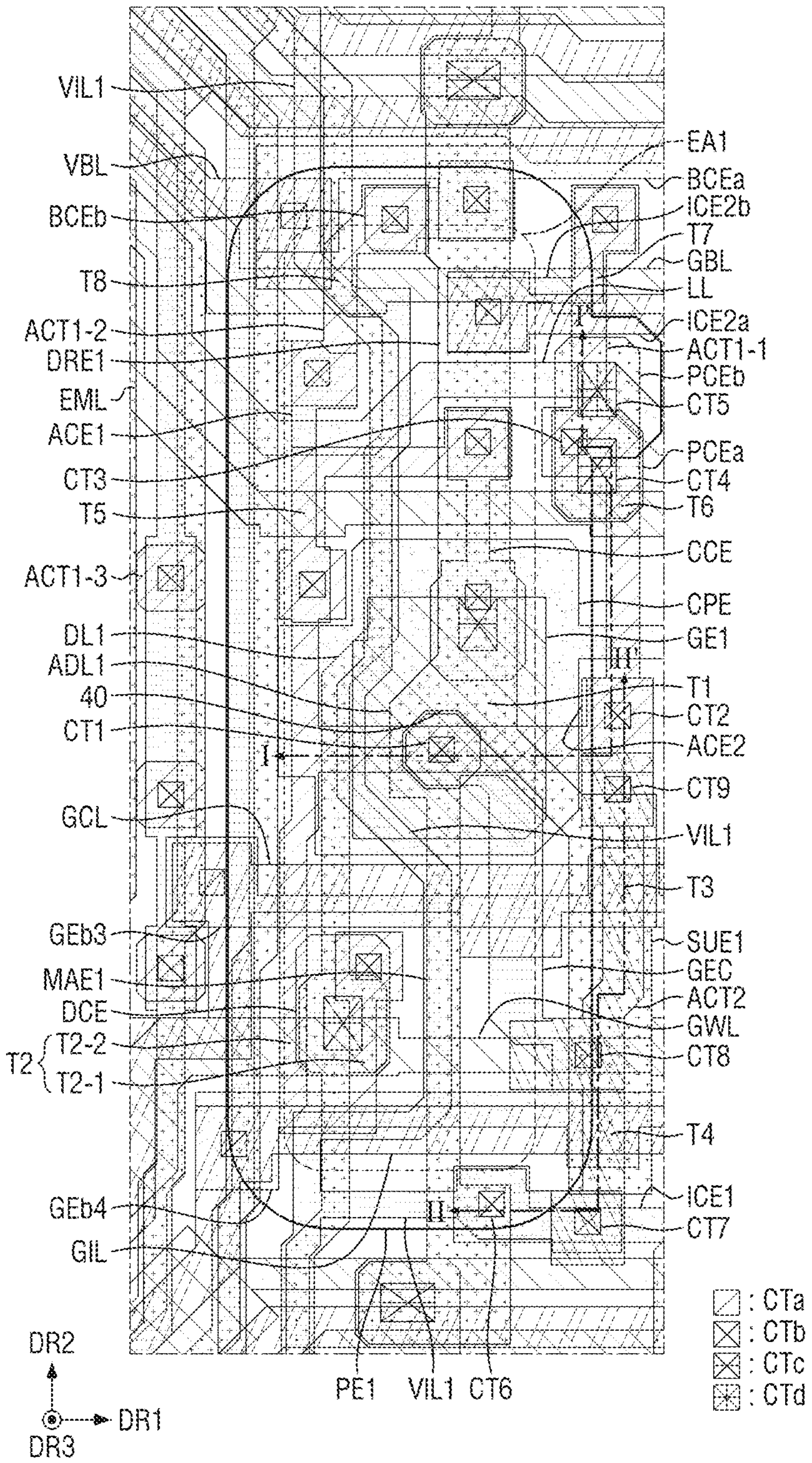
FIG. 5 is an enlarged view of the portion B of FIG. 4A.

FIG. 5 is an enlarged view of the portion B of FIG. 4A. For example, FIG. 5 is an enlarged view of the first pixel PX1 including the first pixel circuit PC1 and the first pixel electrode PE1 of FIG. 4A.

Figure 6:
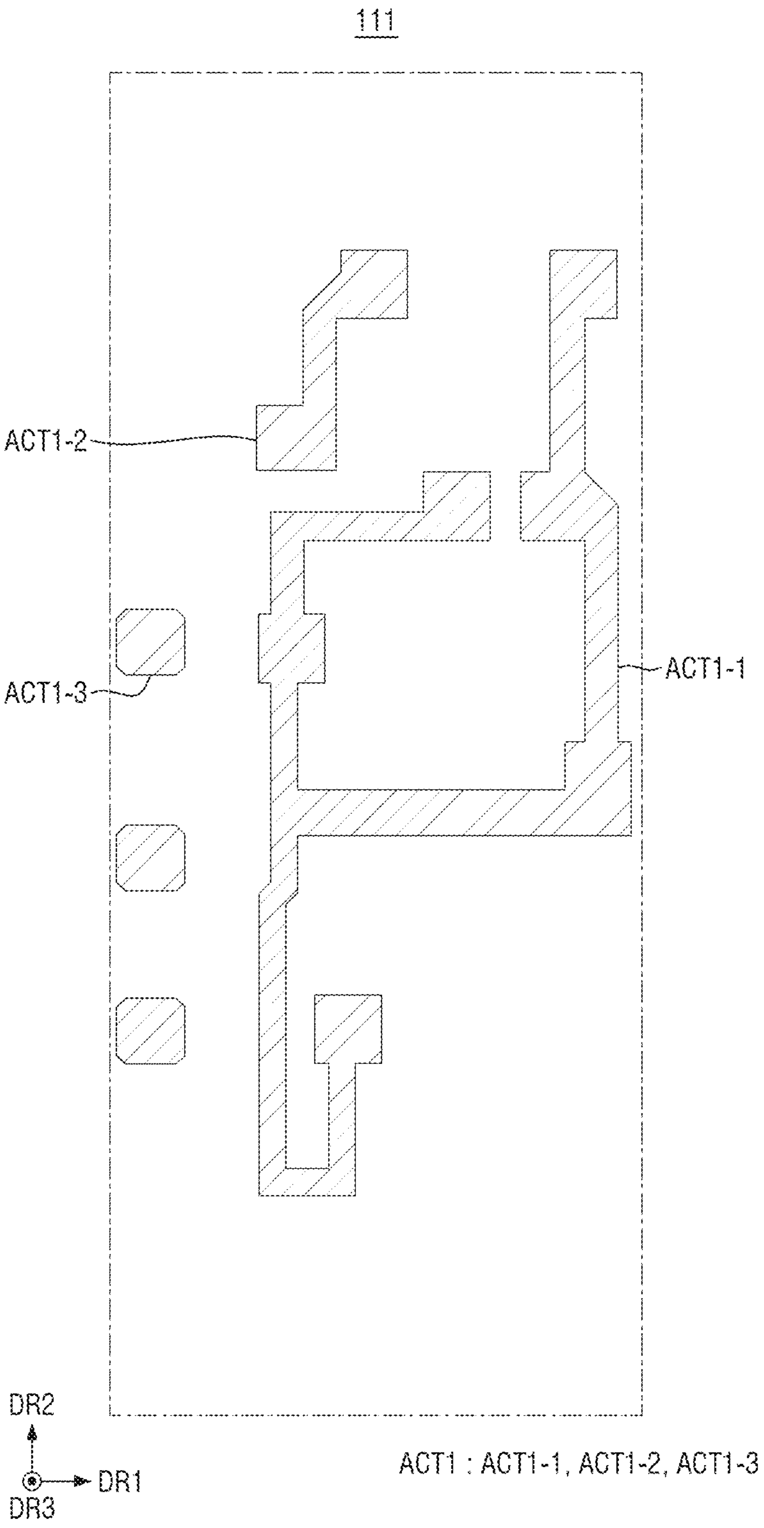
FIG. 6 is a plan view selectively showing a first conductive layer from among the elements of FIG. 5.
Figure 7:
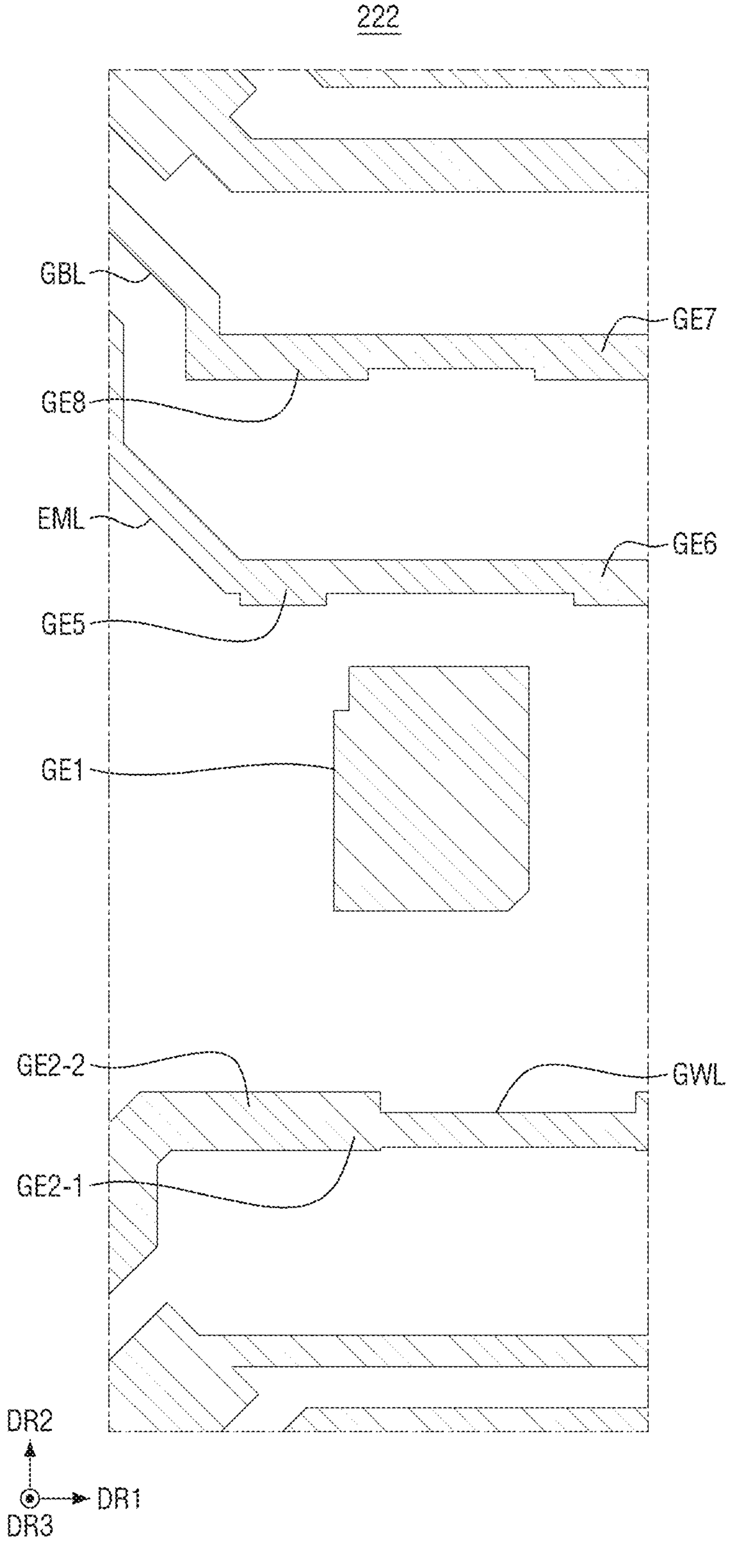
FIG. 7 is a plan view selectively showing a second conductive layer from among the elements of FIG. 5.
Figure 8:
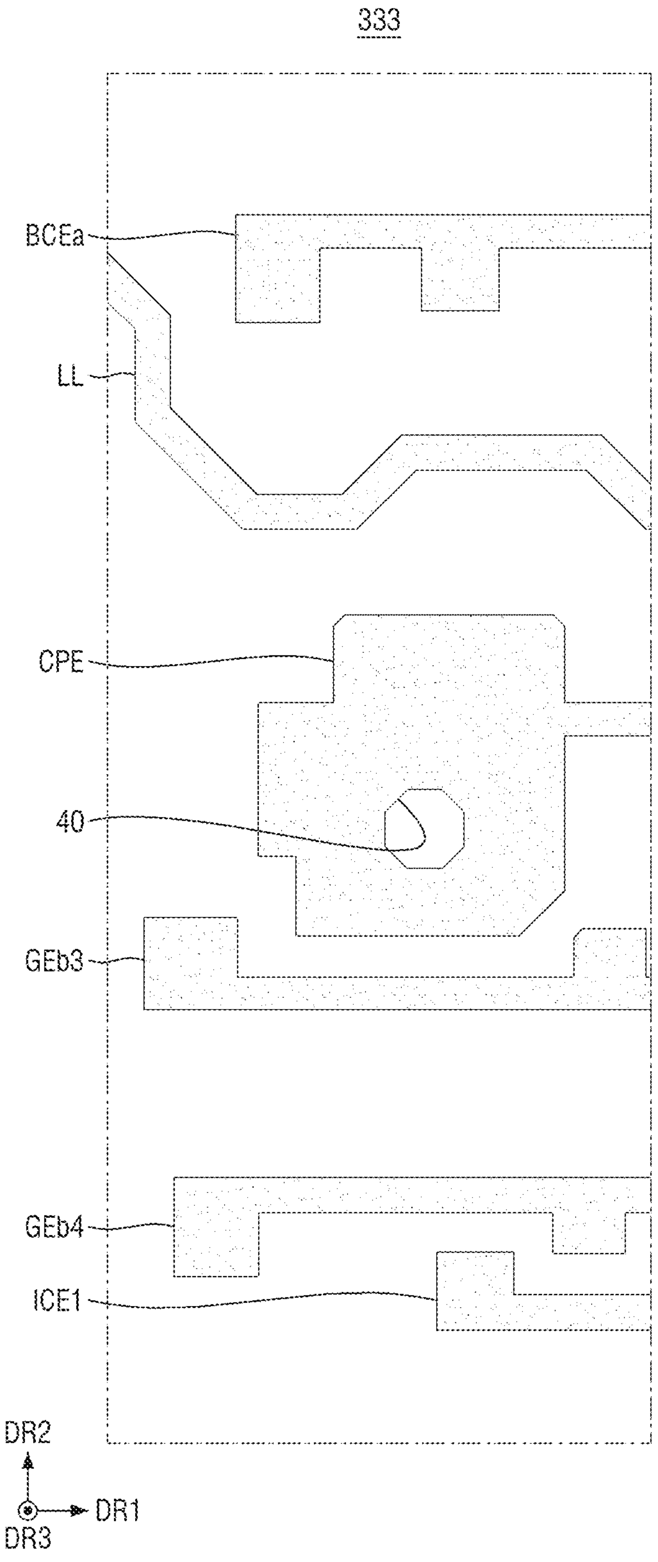
FIG. 8 is a plan view selectively showing a third conductive layer from among the elements of FIG. 5.
Figure 9:
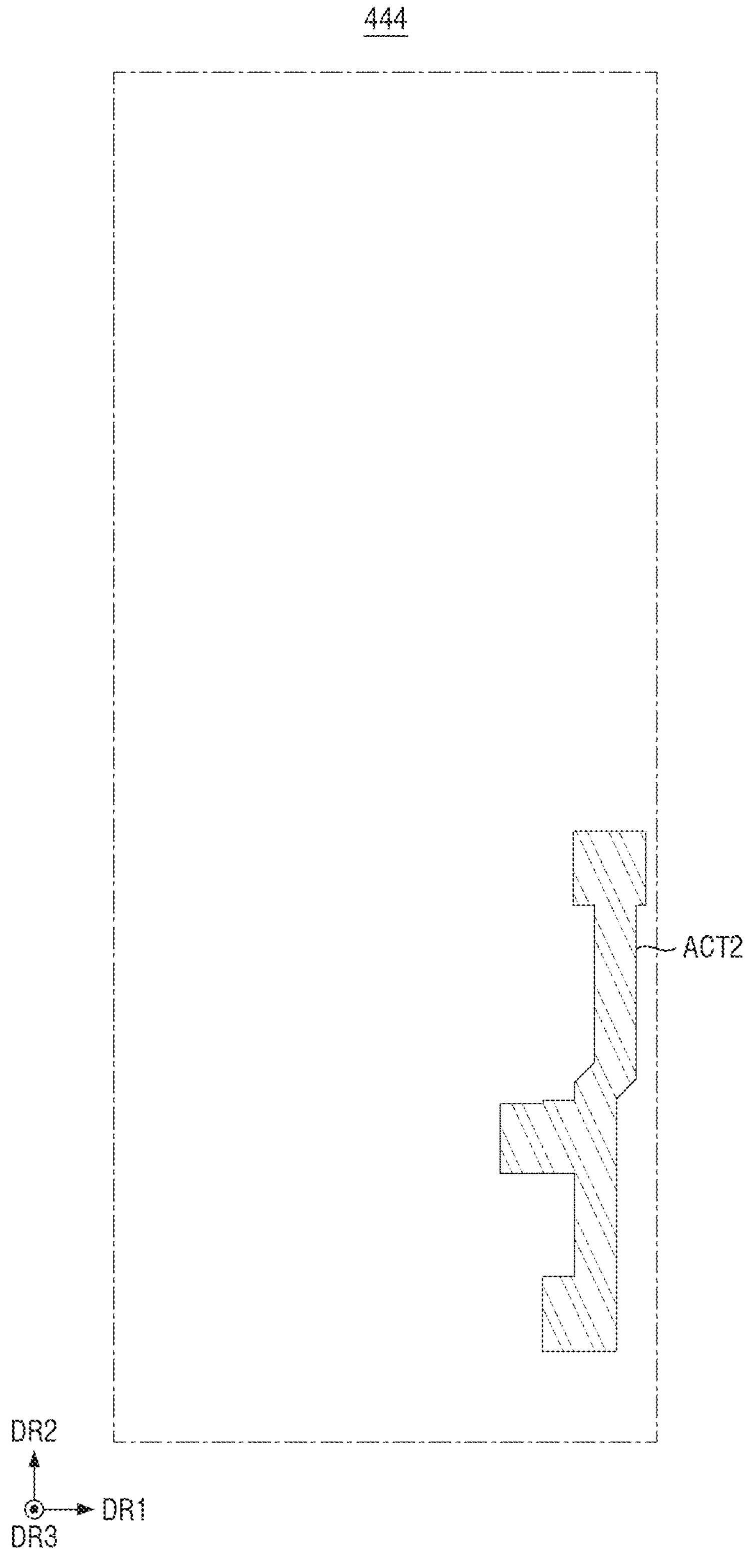
FIG. 9 is a plan view selectively showing a fourth conductive layer from among the elements of FIG. 5.
Figure 10:
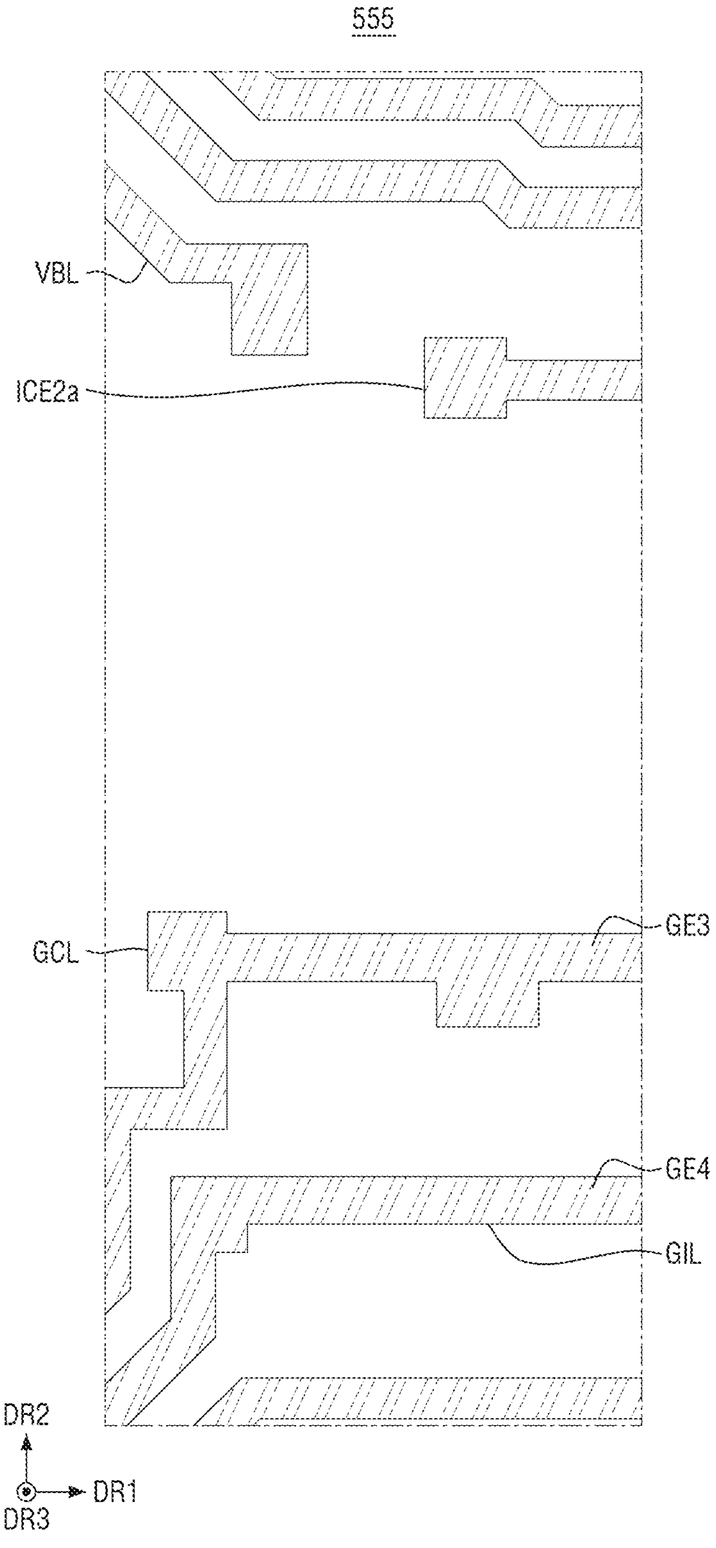
FIG. 10 is a plan view selectively showing a fifth conductive layer from among the elements of FIG. 5.
Figure 11:
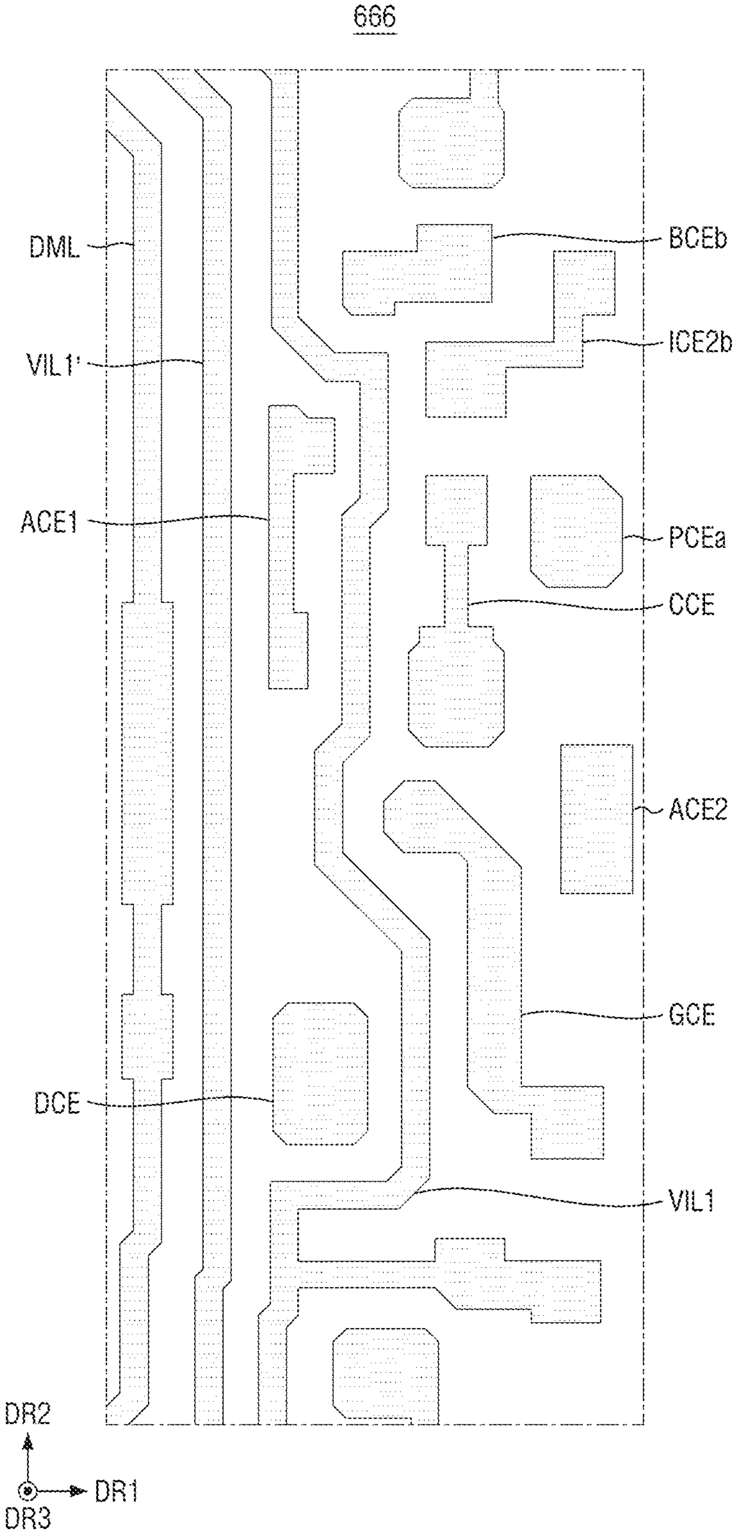
FIG. 11 is a plan view selectively showing a sixth conductive layer from among the elements of FIG. 5.
Figure 12:
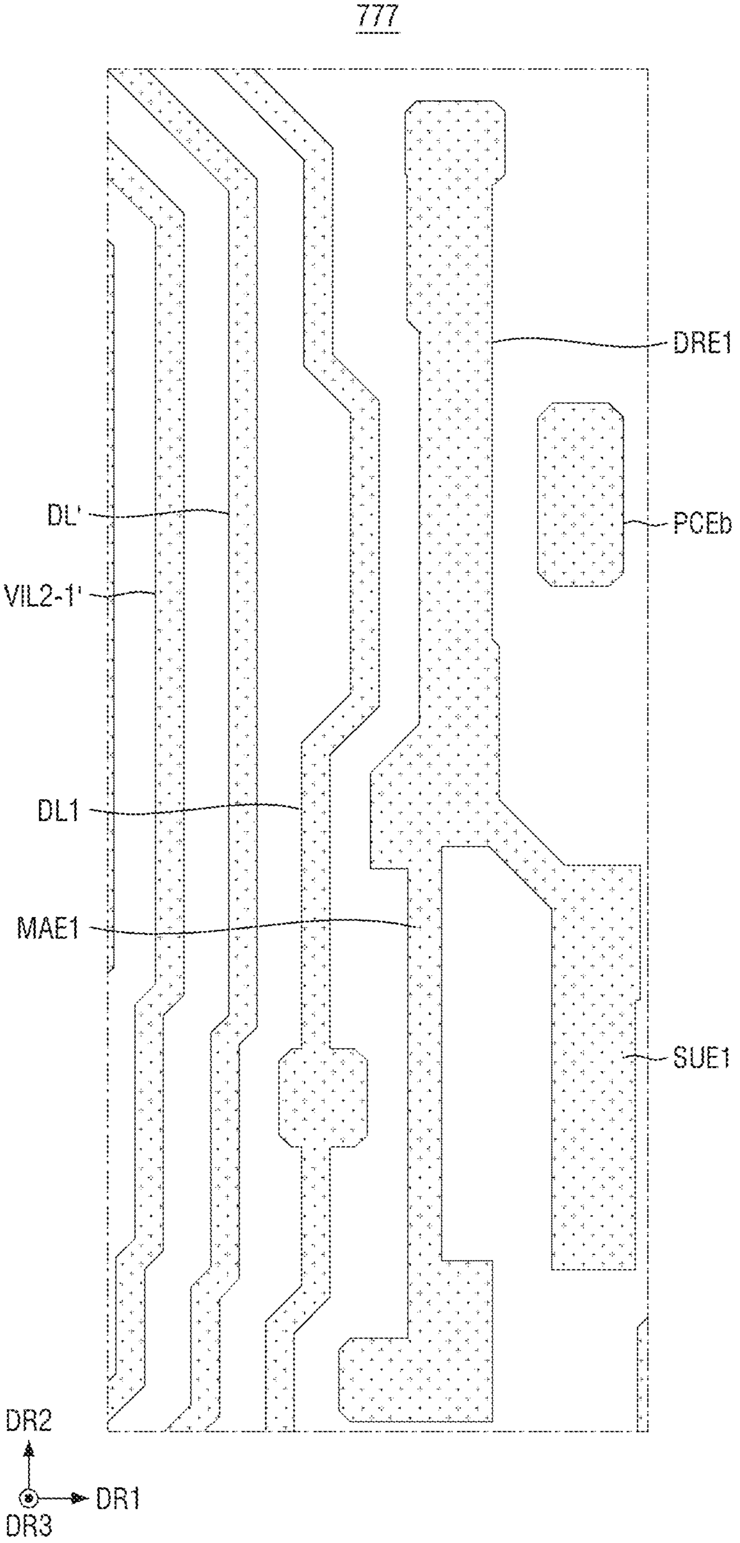
FIG. 12 is a plan view selectively showing a seventh conductive layer from among the elements of FIG. 5.
Figure 13:
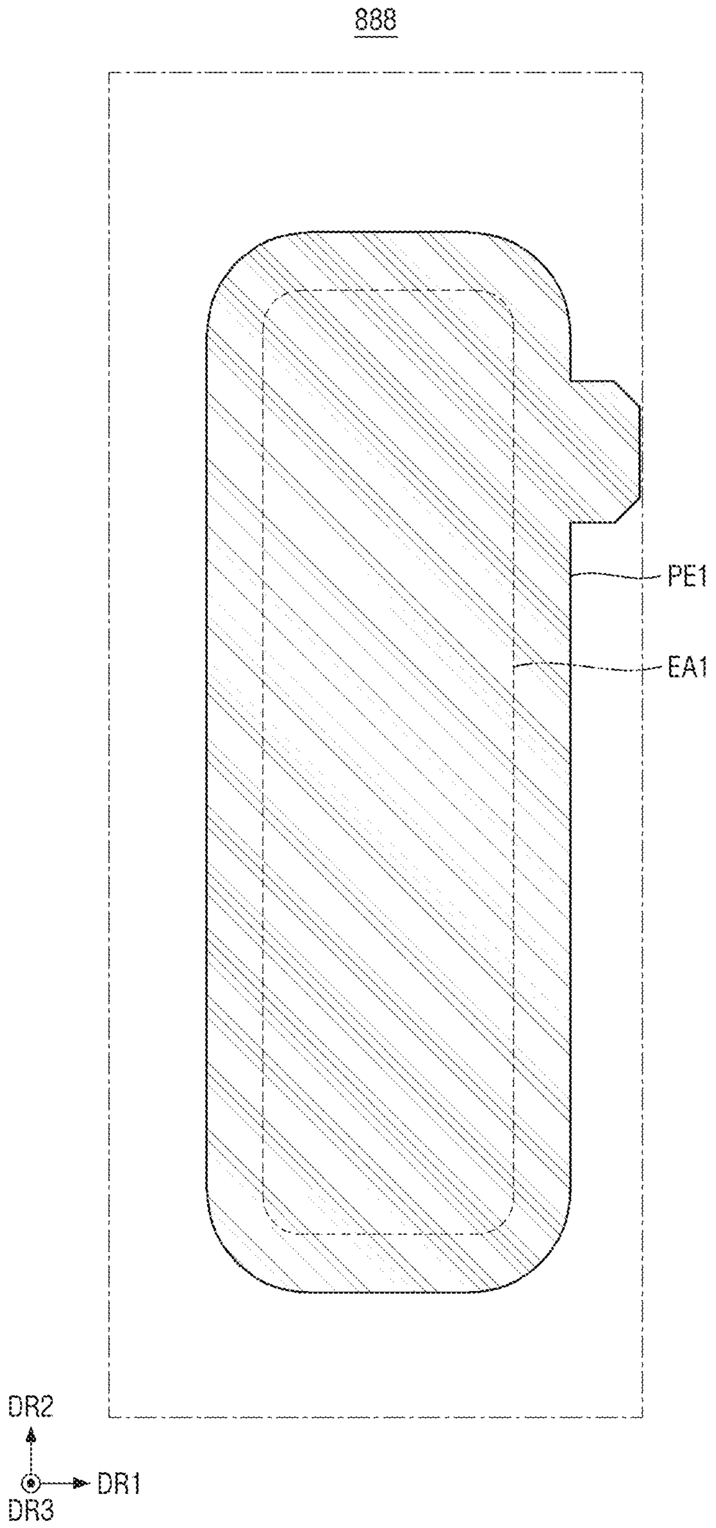
FIG. 13 is a plan view selectively showing an eighth conductive layer from among the elements of FIG. 5.
Figure 14:
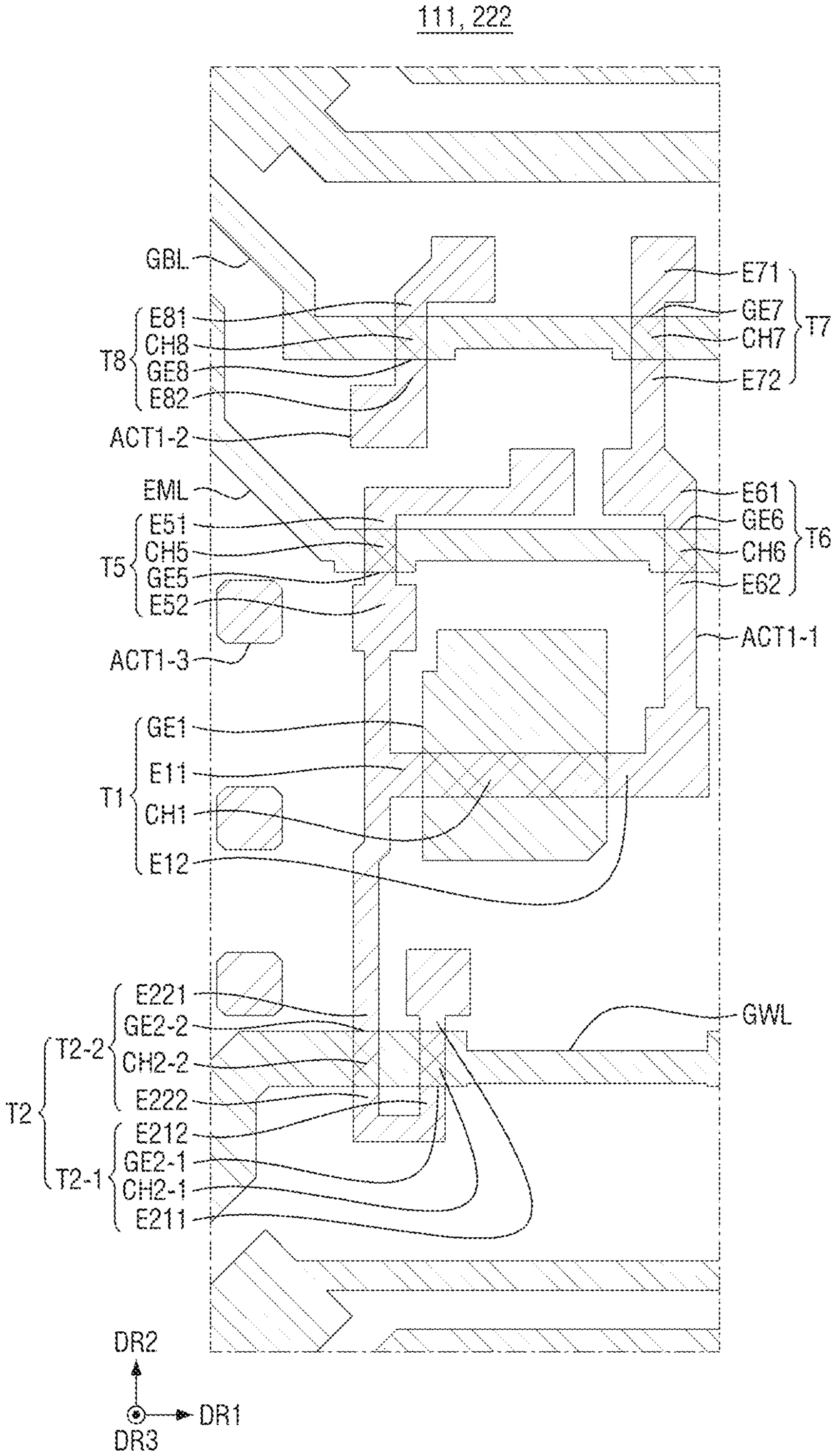
FIG. 14 is a plan view selectively showing first and second conductive layers from among the elements of FIG. 5.
Figure 15:
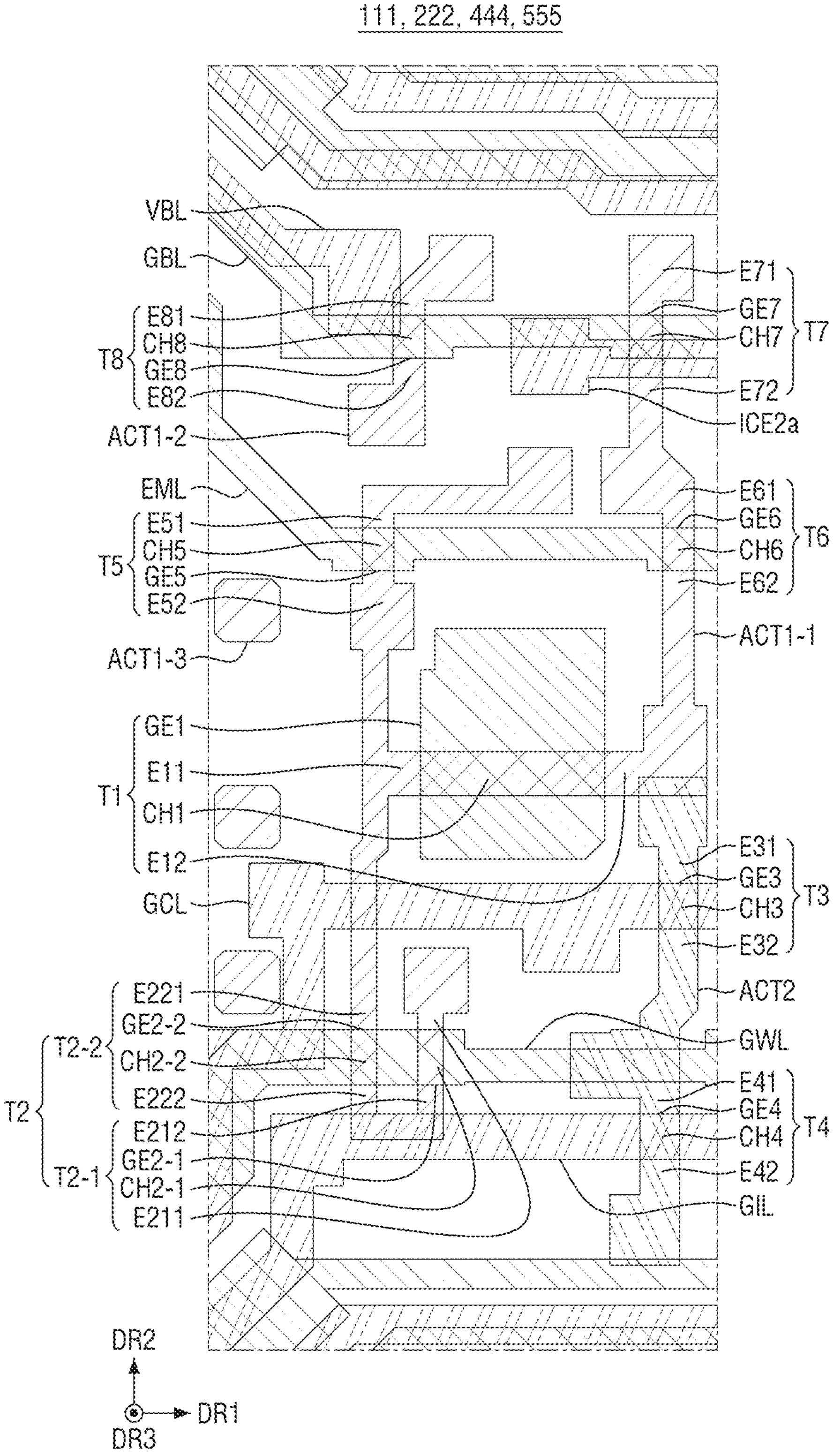
FIG. 15 is a plan view selectively showing first, second, fourth, and fifth conductive layers from among the elements of FIG. 5.
Figure 16:
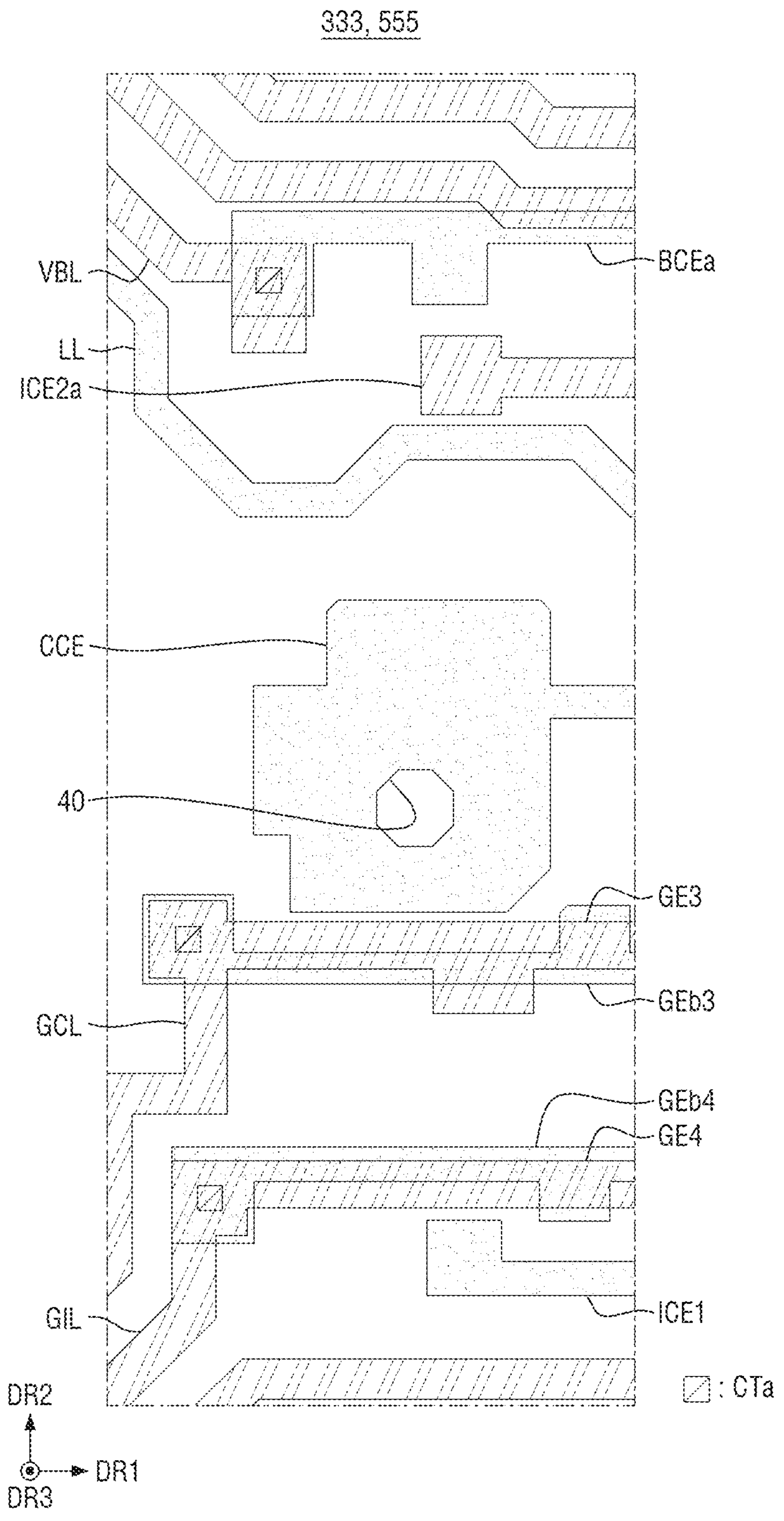
FIG. 16 is a plan view selectively showing third and fifth conductive layers from among the elements of FIG. 5.
Figure 17:
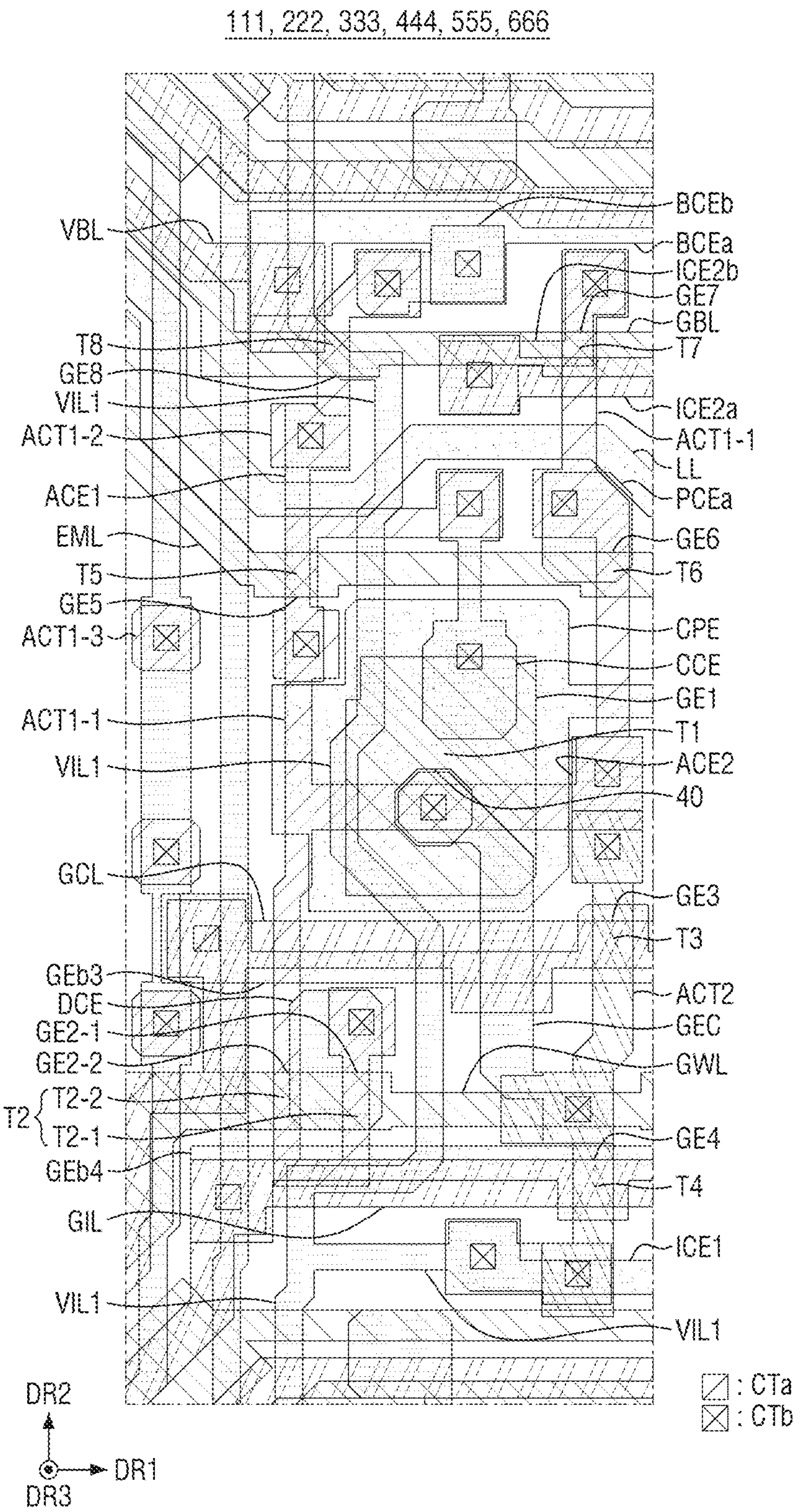
FIG. 17 is a plan view selectively showing first to sixth conductive layers from among the elements of FIG. 5.
Figure 18:
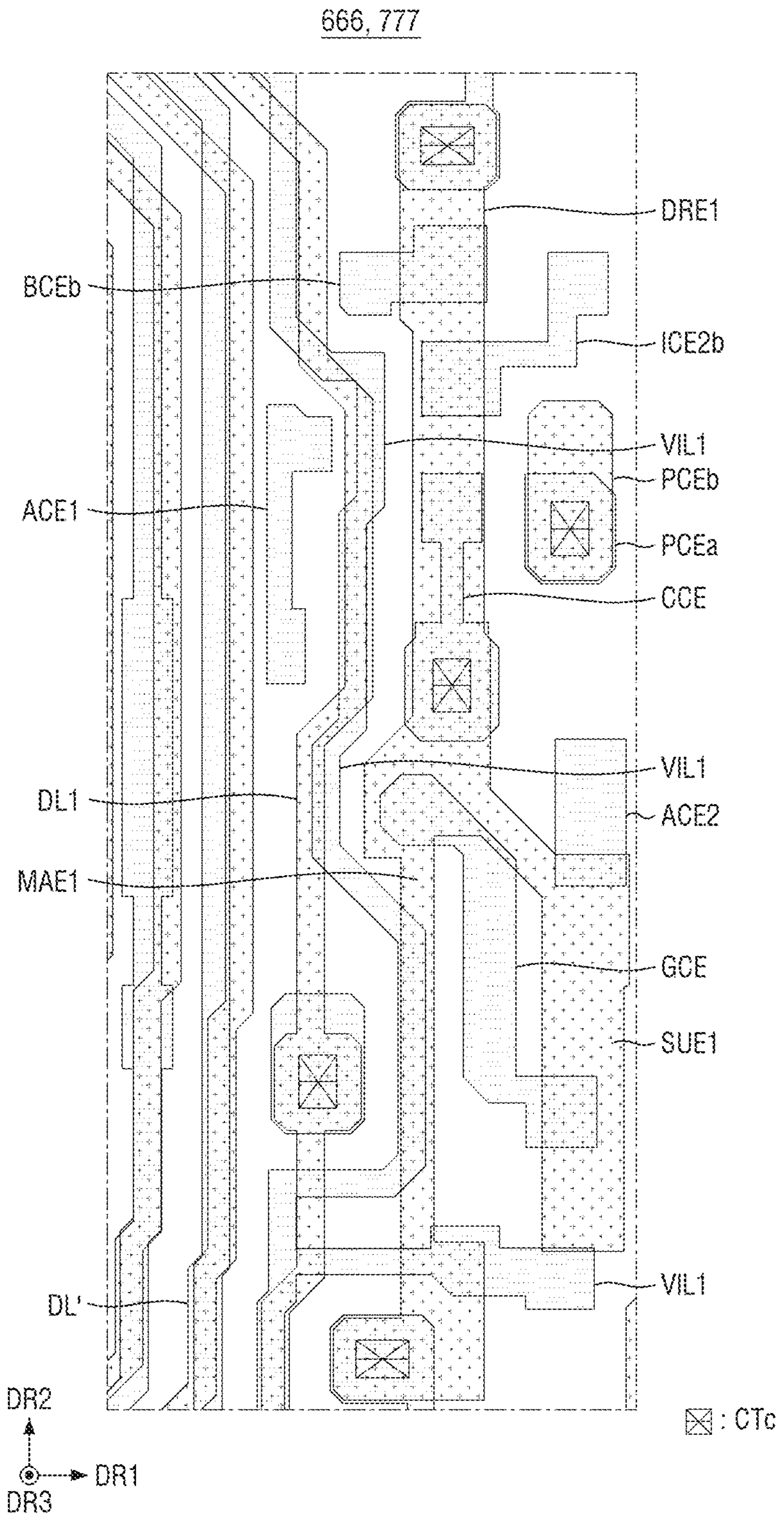
FIG. 18 is a plan view selectively showing sixth and seventh conductive layers from among the elements of FIG. 5.
Figure 19:
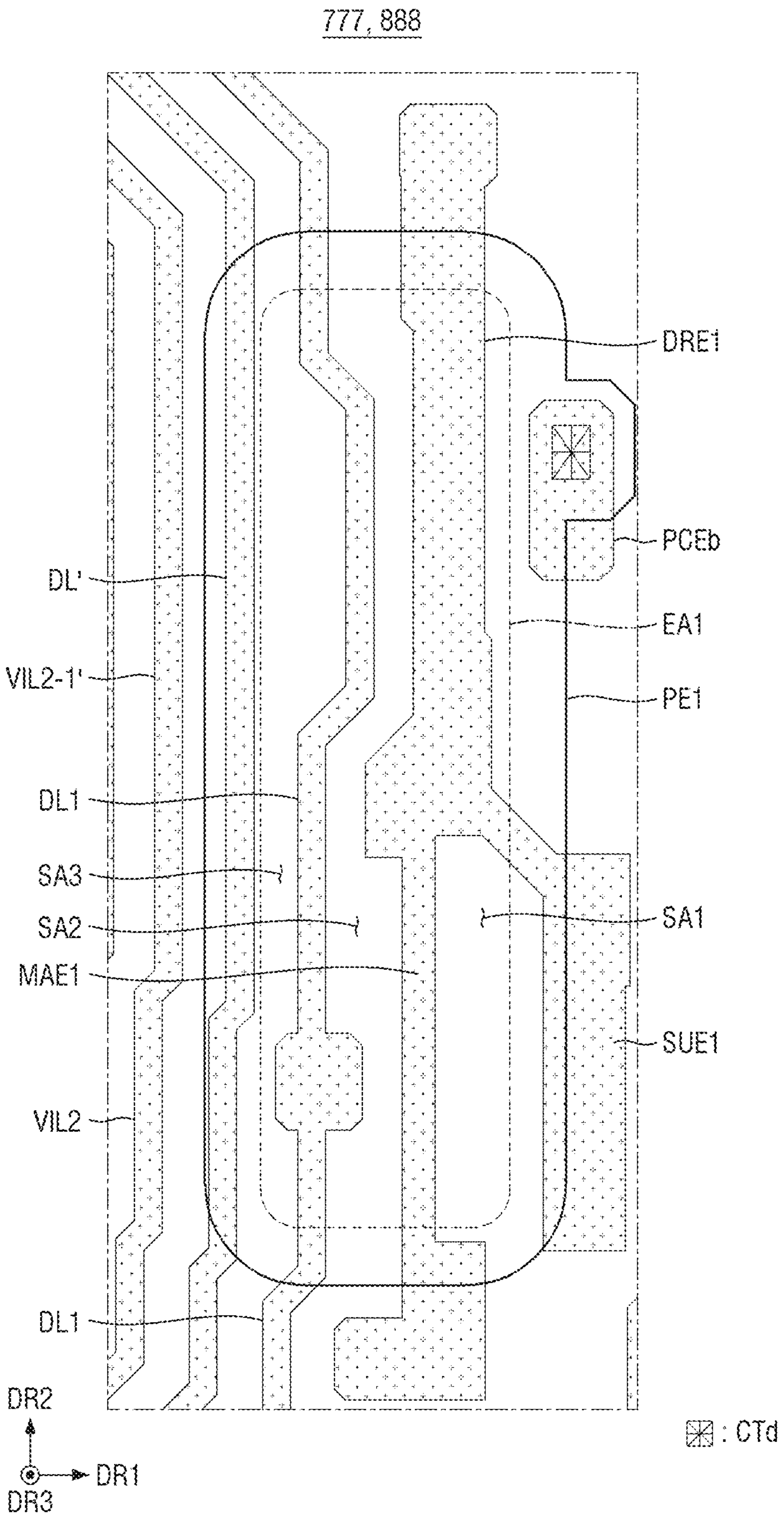
FIG. 19 is a plan view selectively showing seventh and eighth conductive layers from among the elements of FIG. 5.

FIG. 6 is a plan view selectively showing a first conductive layer 111 from among the elements of FIG. 5. FIG. 7 is a plan view selectively showing a second conductive layer 222 from among the elements of FIG. 5. FIG. 8 is a plan view selectively showing a third conductive layer 333 from among the elements of FIG. 5. FIG. 9 is a plan view selectively showing a fourth conductive layer 444 from among the elements of FIG. 5. FIG. 10 is a plan view selectively showing a fifth conductive layer 555 from among the elements of FIG. 5. FIG. 11 is a plan view selectively showing a sixth conductive layer 666 from among the elements of FIG. 5. FIG. 12 is a plan view selectively showing a seventh conductive layer 777 from among the elements of FIG. 5. FIG. 13 is a plan view selectively showing an eighth conductive layer 888 from among the elements of FIG. 5. FIG. 14 is a plan view selectively showing the first and second conductive layers from among the elements of FIG. 5. FIG. 15 is a plan view selectively showing the first, second, fourth and fifth conductive layers from among the elements of FIG. 5. FIG. 16 is a plan view selectively showing the third and fifth conductive layers from among the elements of FIG. 5. FIG. 17 is a plan view selectively showing the first to sixth conductive layers from among the elements of FIG. 5. FIG. 18 is a plan view selectively showing the sixth and seventh conductive layers from among the elements of FIG. 5. FIG. 19 is a plan view selectively showing the seventh and eighth conductive layers from among the elements of FIG. 5.

As shown in FIG. 5, contact holes may include (e.g., may be sorted into) a first-type contact hole (e.g., first contact holes) CTa, a second-type contact hole (e.g., second contact holes) CTb, a third-type contact hole (e.g., third contact holes) CTc, and a fourth-type contact hole (e.g., fourth contact holes) CTd. The first-type contact hole CTa may connect the fifth conductive layer 555 with an underlying conductive layer (e.g., the third conductive layer 333). The second-type contact hole CTb may connect the sixth conductive layer 666 with an underlying conductive layer (e.g., at least one of the first conductive layer to fifth conductive layer 111 to 555). The third-type contact hole CTc may connect the seventh conductive layer 777 with an underlying conductive layer (e.g., the sixth conductive layer 666). The fourth-type contact hole CTd may connect the eighth conductive layer 888 with an underlying conductive layer (e.g., the seventh conductive layer 777).

The first conductive layer 111 may be disposed on the substrate along the third direction DR3. The first conductive layer 111 may include a first active layer ACT1 as illustrated in the example shown in FIGS. 5, 6 and 14. The first active layer ACT1 may include a (1-1) active layer ACT1-1, a (1-2) active layer ACT1-2, and a (1-3) active layer ACT1-3.

The (1-1) active layer ACT1-1 may provide channel regions CH1, CH2-1, CH2-2, CH5, CH6, and CH7, first electrodes E11, E221, E51, E61, and E71, and second electrodes E12, E222, E52, E62, and E72 of the first transistor T1, the (2-1) transistor T2-1, the (2-2) transistor T2-2, the fifth transistor T5, the sixth transistor T6, and the seventh transistor T7, respectively.

The (1-2) active layer ACT1-2 may provide an eighth channel region CH8, a first electrode E81, and a second electrode E82 of the eighth transistor T8.

The (1-3) active layer ACT1-3 may be a dummy active layer for adjusting a density of contact holes of the pixels.

Each of the (1-1) active layer ACT1-1, the (1-2) active layer ACT1-2, and the (1-3) active layer ACT1-3 may be a semiconductor layer made of low-temperature polycrystalline silicon (LTPS).

The second conductive layer 222 may be disposed on the first conductive layer 111 in the third direction DR3. An insulating film may be disposed between the first conductive layer 111 and the second conductive layer 222. As in the example shown in FIGS. 5, 7, 14, and 15, the second conductive layer 222 may include the fourth gate line GBL, the emission control line EML, the first gate line GWL, and the first gate electrode GE1.

The fourth gate line GBL may include an eighth gate electrode GE8 and a seventh gate electrode GE7. For example, a part of the fourth gate line GBL may be the eighth gate electrode GE8, and another part of the fourth gate line GBL may be the seventh gate electrode GE7.

The emission control line EML may include a fifth gate electrode GE5 and a sixth gate electrode GE6. For example, a part of the emission control line EML may be the fifth gate electrode GE5, and another part of the emission control line EML may be the sixth gate electrode GE6.

The first gate line GWL may include a (2-2) gate electrode GE2-2 and a (2-1) gate electrode GE2-1. For example, a part of the first gate line GWL may be the (2-2) gate electrode GE2-2, and another part of the first gate line GWL may be the (2-1) gate electrode GE2-1.

The first, (2-1), (2-2), fifth, sixth, and seventh gate electrodes GE1, GE2-1, GE2-2, GE5, GE6, and GE7 may overlap with the (1-1) active layer ACT1-1.

The eighth gate electrode GE8 may overlap with the (1-2) active layer ACT1-2.

The channel regions CH1, CH2-1, CH2-2, CH5, CH6, and CH7 of the first, (2-1), (2-2), fifth, sixth, and seventh transistors T1, T2-1, T2-2, T5, T6 and T7 may be formed where the first, (2-1), (2-2), fifth, sixth, and seventh gate electrodes GE1, GE2, GE5, GE6, and GE7 overlap with the (1-1) active layer ACT1-1.

The eighth channel region CH8 of the eighth transistor T8 may be formed where the eighth gate electrode GE8 overlaps with the (1-2) active layer ACT1-2.

The first transistor T1 may include the first gate electrode GE1, the first electrode E11, the second electrode E21, and the first channel region CH1. The (2-1) transistor T2-1 may include the (2-1) gate electrode GE2-1, the first electrode E211, the second electrode E212, and the (2-1) channel region CH2-1. The (2-2) transistor T2-2 may include the (2-2) gate electrode GE2-2, the first electrode E221, the second electrode E222, and the (2-2) channel region CH2-2. The fifth transistor T5 may include the fifth gate electrode GE5, the first electrode E51, the second electrode E52, and the fifth channel region CH5. The sixth transistor T6 may include the sixth gate electrode GE6, the first electrode E61, the second electrode E62, and the sixth channel region CH6. The seventh transistor T7 may include the seventh gate electrode GE7, the first electrode E71, the second electrode E72, and the seventh channel region CH7. The eighth transistor T8 may include the eighth gate electrode GE8, the first electrode E81, the second electrode E82, and the eighth channel region CH8.

The third conductive layer 333 may be disposed on the second conductive layer 222 in the third direction DR3. An insulating film may be disposed between the second conductive layer 222 and the third conductive layer 333. As shown in FIGS. 5, 8, and 17, the third conductive layer 333 may include a lower bias connection electrode BCEa, a connection line LL, a capacitor electrode CPE, a third counter gate electrode GEb3, a fourth counter gate electrode GEb4, and a first initialization connection electrode ICE1.

The lower bias connection electrode BCEa may be connected to the bias voltage line VBL through an upper bias connection electrode BCEb, which will be described in more detail below.

The connection line LL may connect between the pixel circuits of the first display area DA1. The connection line LL may be connected to pixel circuits of the first display area DA1 facing each other with the second display area DA2 therebetween.

The connection line LL may be, for example, a line for alternately transmitting the second gate signal GC and the third gate signal GI to the pixel circuits of the first display area DA1.

The capacitor electrode CPE may be disposed to overlap with the first gate electrode GE1. The capacitor Cst may be formed where the capacitor electrode CPE and the first gate electrode GE1 overlap with each other. For example, the capacitor electrode CPE and the first gate electrode GE1 may correspond to the first electrode and the second electrode of the capacitor Cst, respectively. In addition, the capacitor electrode CPE may have a hole 40 penetrating through it in the third direction. The first gate electrode GE1 may be connected to a first electrode E32 of the third transistor T3 through the hole 40 of the capacitor Cst and a gate connection electrode GCE. In addition, the capacitor electrode CPE may be connected to the first driving voltage line VDL through a capacitor connection electrode CCE and a first driving electrode DRE1, which will be described in more detail below.

Referring to FIG. 17, the third counter gate electrode GEb3 may overlap with the first active layer ACT1-1 and the third gate electrode GE3. For example, the third counter gate electrode GEb3 may face the third gate electrode GE3 with the (1-1) active layer ACT1-1 therebetween.

The fourth counter gate electrode GEb4 may overlap with the (1-1) active layer ACT1-1 and the fourth gate electrode GE4. For example, the fourth counter gate electrode GEb4 may face the fourth gate electrode GE4 with the (1-1) active layer ACT1-1 therebetween.

The fourth conductive layer 444 may be disposed on the third conductive layer 333 in the third direction DR3. An insulating film may be disposed between the third conductive layer 333 and the fourth conductive layer 444. The fourth conductive layer 444 may include a second active layer ACT2 as in the example shown in FIGS. 5, 9, and 15. The second active layer ACT2 may provide the channel regions CH3 and CH4, the first electrodes E31 and E41, and the second electrodes E32 and E42 of the third and fourth transistors T3 and T4.

The second active layer ACT2 may be, for example, an oxide-based semiconductor.

The fifth conductive layer 555 may be disposed on the fourth conductive layer 444 in the third direction DR3. An insulating film may be disposed between the fourth conductive layer 444 and the fifth conductive layer 555. As in the example shown in FIGS. 5, 10, 15, and 16, the fifth conductive layer 555 may include a bias voltage line VBL, a second lower initialization connection electrode ICE2*a*, a second gate line GCL, and a third gate line GIL.

The bias voltage line VBL may transmit the bias voltage VB. As shown in FIG. 16, the bias voltage line VBL may be connected to the lower bias connection electrode BCEa through a first-type contact hole (e.g., one first contact hole) CTa of the insulating film.

The second lower initialization connection electrode ICE2*a* may transmit the (2-1) initialization voltage. As such, the second lower initialization connection electrode ICE2*a* may be connected to the (2-1) initialization voltage line VIL2-1 (e.g., see FIG. 4A) through a second-type contact hole (e.g., one second contact hole) CTb of the insulating film.

The second gate line GCL may include the third gate electrode GE3. For example, a part of the second gate line GCL may be the third gate electrode GE3. As shown in FIG. 16, the second gate line GCL may be connected to the third counter gate electrode GEb3 through a first-type contact hole (e.g., one first contact hole) CTa of the insulating film.

The third gate line GIL may include the fourth gate electrode GE4. For example, a part of the third gate line GIL may be the fourth gate electrode GE4. As shown in FIG. 16, the third gate line GIL may be connected to the fourth counter gate electrode GEb4 through a first-type contact hole (e.g., one first contact hole) CTa of the insulating film.

The third gate electrode GE3 and the fourth gate electrode GE4 may overlap with the second active layer ACT2.

The channel regions CH3 and CH4 of the third and fourth transistors T3 and T4 may be formed where the third and fourth gate electrodes GE3 and GE4 and the second active layer ACT2 overlap with each other.

The third transistor T3 may include the third gate electrode GE3, the first electrode E31, the second electrode E31, and the third channel region CH3. The fourth transistor T4 may include the fourth gate electrode GE4, the first electrode E41, the second electrode E42, and the fourth channel region CH4.

The sixth conductive layer 666 may be disposed on the fifth conductive layer 555 in the third direction DR3. An insulating film may be disposed between the fifth conductive layer 555 and the sixth conductive layer 666. As in the example shown in FIGS. 5, 11, and 17, the sixth conductive layer 666 may include an upper bias connection electrode BCEb, a second upper initialization connection electrode ICE2*b*, a first active connection electrode ACE1, a lower pixel connection electrode PCE*a*, a capacitor connection electrode CCE, a second active connection electrode ACE2, a gate connection electrode GCE, a data connection electrode DCE, and a first initialization voltage line VIL1.

As shown in FIG. 17, the upper bias connection electrode BCEb may be connected to the lower bias connection electrode BCEa through a second-type contact hole (e.g., one second contact hole) CTb of the insulating film. In addition, the upper bias connection electrode BCEb may be connected to the first electrode of the (1-2) active layer ACT1-2 (e.g., the first electrode E81 of the eighth transistor T8) through the second-type contact hole CTb of the insulating film.

The second upper initialization connection electrode ICE2*b* may be connected to the second lower initialization connection electrode ICE2*a* through a second-type contact hole (e.g., one second contact hole) CTb of the insulating film. In addition, the second upper initialization connection electrode ICE2*b* may be connected to the first electrode of the (1-1) active layer ACT1-1 (e.g., the first electrode E71 of the seventh transistor T7) through a second-type contact hole (e.g., one second contact hole) CTb of the insulating film.

The first active connection electrode ACE1 may be connected to the second electrode of the (1-2) active layer ACT1-2 (e.g., the second electrode E82 of the eighth transistor T8) through a second-type contact hole (e.g., one second contact hole) CTb of the insulating film. In addition, the first active connection electrode ACE1 may be connected to the second electrode of the (1-1) active layer ACT1-1 (e.g., the second electrode E52 of the fifth transistor T5) through a second-type contact hole (e.g., one second contact hole) CTb of the insulating film.

Still referring to FIG. 17, the lower pixel connection electrode PCEa may be connected to the first electrode of the (1-1) active layer ACT1-1 (e.g., the first electrode E61 of the sixth transistor T6) through a second-type contact hole (e.g., one second contact hole) CTb of the insulating film.

The capacitor connection electrode CCE may be connected to the first electrode of the (1-1) active layer ACT1-1 (e.g., the first electrode E51 of the fifth transistor T5) through a second-type contact hole (e.g., one second contact hole) CTb of the insulating film. In addition, the capacitor connection electrode CCE may be connected to the capacitor electrode CPE through a second-type contact hole (e.g., one second contact hole) CTb of the insulating film.

The second active connection electrode ACE2 may be connected to the second electrode of the (1-1) active layer ACT1-1 (e.g., the second electrode E12 of the first transistor T1) through a second-type contact hole (e.g., one second contact hole) CTb of the insulating film. In addition, the second active connection electrode ACE2 may be connected to the first electrode of the second active layer ACT2 (e.g., the first electrode E31 of the third transistor T3) through a second-type contact hole (e.g., one second contact hole) CTb of the insulating film.

The gate connection electrode GCE may be connected to the first gate electrode GE1 through a second-type contact hole (e.g., one second contact hole) CTb of the insulating film and the hole 40 of the capacitor electrode CPE. In addition, the gate connection electrode GCE may be connected to the second electrode of the second active layer ACT2 (e.g., the second electrode E32 of the third transistor T3) and the first electrode of the second active layer ACT2 (e.g., the first electrode E41 of the fourth transistor T4) through a second-type contact hole (e.g., one second contact hole) CTb of the insulating film.

Still referring to FIG. 17, the data connection electrode DCE may be connected to the first electrode of the (1-1) active layer ACT1-1 (e.g., the first electrode E211 of the (2-1) transistor T2-1) through a second-type contact hole (e.g., one second contact hole) CTb of the insulating film.

The first initialization voltage line VIL1 may be connected to the first initialization connection electrode ICE1 through a second-type contact hole (e.g., one second contact hole) CTb of the insulating film. In addition, the first initialization voltage line VIL1 may be connected to the second electrode of the second active layer ACT2 (e.g., the second electrode E42 of the fourth transistor T4) through a second-type contact hole (e.g., one second contact hole) CTb of the insulating film.

In the sixth conductive layer 666 shown in FIG. 11, a first initialization voltage line VIL1' may be connected to another unit pixel, and a dummy line DML may form a second-type contact hole (e.g., one second contact hole or a dummy contact hole) CTb connected to the (1-3) active layer ACT1-3.

Incidentally, as illustrated in FIGS. 4A and 4B, the sixth conductive layer 666 may further include the (2-1) initialization voltage line VIL2-1, the (2-2) initialization voltage line VIL2-2, and the first driving voltage line VDL. The (2-1) initialization voltage line VIL2-1 may be connected to the second upper initialization connection electrode ICE2*b* through a second-type contact hole (e.g., one second contact hole) CTb of the insulating film. In addition, the (2-1) initialization voltage line VIL2-1 may be connected to the first electrode of the seventh transistor T7 disposed in the second pixel circuit PC2 through a second-type contact hole (e.g., one second contact hole) CTb of the insulating film. The (2-2) initialization voltage line VIL2-2 may be connected to the first electrode of the seventh transistor T7 disposed in the third pixel circuit PC3 through a second-type contact hole (e.g., one second contact hole) CTb of the insulating film.

The seventh conductive layer 777 may be disposed on the sixth conductive layer 666 in the third direction DR3. An insulating film may be disposed between the sixth conductive layer 666 and the seventh conductive layer 777. As in the example shown in FIGS. 4, 5, 12, and 18, the seventh conductive layer 777 may include a first data line DL1, a first driving electrode DRE1, and an upper pixel connection electrode PCEb.

As shown in FIG. 18, the first data line DL1 may be connected to a data connection electrode DCE through a third-type contact hole (e.g., one third contact hole) CTc of the insulating film.

The upper pixel connection electrode PCEb may be connected to a lower pixel connection electrode PCEa through a third-type contact hole (e.g., one third contact hole) CTc of the insulating film.

As shown in FIGS. 4A and 4B, the first driving electrode DRE1 may be connected to the first driving voltage line VDL (e.g., the first driving voltage line VDL on the upper side) through a third-type contact hole (e.g., one third contact hole) CTc of the insulating film. In addition, as shown in FIG. 18, the first driving electrode DRE1 may be connected to the capacitor connection electrode CCE through a third-type contact hole (e.g., one third contact hole) CTc. In addition, the first driving electrode DRE1 may be connected to the first driving voltage line VDL (e.g., the first driving voltage line VDL on the lower side) through a third-type contact hole (e.g., one third contact hole) CTc of the insulating film. In addition, as shown in FIG. 4, the first driving electrode DRE1 may be connected to a second driving electrode DRE2 of the second pixel circuit PC2 and a third driving electrode DRE3 of the third pixel circuit PC3. For example, because the first driving electrode DRE1, the second driving electrode DRE2, and the third driving electrode DRE3 are commonly connected to the capacitor electrode CPE, the first driving voltage VD provided to the first driving electrode DRE1 from the first driving voltage line VDL may be applied to the second driving electrode DRE2 and the third driving electrode DRE3 through the capacitor electrode CPE.

As shown in FIG. 12, the first driving electrode DRE1 may include a first main electrode MAE1 and a first sub-electrode SUE1.

The first main electrode MAE1 may be extended in the second direction DR2. The first main electrode MAE1 may be connected to the first driving voltage line VDL and the capacitor connection electrode CCE through the three third-type contact holes CTc described above.

The first sub-electrode SUE1 may branch off from the first main electrode MAE1. For example, the first sub-electrode SUE1 may branch off from the first main electrode MAE1 in a downward diagonal direction (e.g., a direction between the first direction DR1 and opposite second direction −DR2), and may be extended in the opposite second direction (hereinafter referred to as a second opposite direction) −DR2. In other words, the first sub-electrode SUE1 may be extended in a direction parallel to or substantially parallel to the direction in which the first main electrode MAE1 is extended. The first sub-electrode SUE1 may be spaced apart from the first main electrode MAE1 by a suitable distance (e.g., a predetermined distance) in the first direction DR1. Accordingly, a gap may be located between the first main electrode MAE1 and the first sub-electrode SUE1.

As shown in FIG. 5, the gap between the first main electrode MAE1 and the first sub-electrode SUE1 may overlap with a first emission area EA1. In addition, an edge of a bank defining the first emission area EA1 may overlap with the gap.

The gap between the first main electrode MAE1 and the first sub-electrode SUE1 may form an inverted U shape.

The first driving electrode DRE1 will be described in more detail below.

A data line DL' may be connected to another unit pixel, and a (2-1) initialization voltage line VIL2-1 may be connected to another unit pixel.

The eighth conductive layer 888 may be disposed on the seventh conductive layer 777 in the third direction DR3. An insulating film may be disposed between the seventh conductive layer 777 and the eighth conductive layer 888. The eighth conductive layer 888 may include the first pixel electrode PE1 as in the example shown in FIGS. 5, 13, and 19.

A part of the first pixel electrode PE1 may be exposed by the bank described in more detail below. For example, the bank may have a first open area corresponding to the first emission area EA1 (hereinafter, collectively referred to as the first emission area EA1), and exposing a part of the first pixel electrode PE1. In addition, the bank may further include a second emission area EA2 exposing a part of the second pixel electrode PE2, and a third emission area EA3 exposing a part of the third pixel electrode PE3. The first emission area EA1 may overlap with the first pixel electrode PE1 excluding the edges. A first emissive layer may be disposed on the first pixel electrode PE1 overlapping with the first emission area EA1.

The first pixel electrode PE1 may be connected to a first upper pixel connection electrode PCEb through a fourth-type contact hole (e.g., one fourth contact hole) CTd of the insulating film.

Incidentally, as shown in FIG. 19, the first sub-electrode SUE1 of the first driving electrode DRE1 may be spaced apart from the first main electrode MAE1 by a suitable distance (e.g., a predetermined distance) in the first direction DR1. Accordingly, the gap may be located between the first main electrode MAE1 and the first sub-electrode SUE1. In the plan view of FIG. 19, the first emission area EA1 may be divided into two sub-emission areas SA1 and SA2 with respect to the first main electrode MAE1. For example, in the plan view, the first main electrode MAE1 may cross the first emission area EA1 in the second direction DR2 to overlap with the first emission area EA1, so that the first emission area EA1 is divided into at least two sub-emission areas SA1 and SA2 (e.g., along the first direction DR1). The first sub-emission area SA1 may be disposed on the right side of the first main electrode MAE1, and the second sub-emission area SA2 may be disposed on the left side of the first main electrode MAE1. Accordingly, the gap is formed between the first main electrode MAE1 and the first sub-electrode SUE1, and spaces may be formed on the left side and the right side of the first main electrode MAE1, respectively, by the gap. Therefore, a distribution density of the seventh conductive layer 777 may be uniform or substantially uniform in the first emission area EA1 in the first direction DR1.

The first data line DL1 adjacent to the first main electrode MAE1 crosses and overlaps with the first emission area EA1, and accordingly, the first emission area EA1 may be further divided by the first data line DL1. For example, the first emission area EA1 may be defined as a first sub-emission area SA1, the second sub-emission area SA2, and the third sub-emission area SA3 by the main electrode MAE1, the gap (e.g., the gap between the first main electrode MAE1 and the first sub-electrode SUE1), and the first data line DL1. Accordingly, a level difference of the insulating film (e.g., a first planarization film VA1) disposed on the seventh conductive layer 777 (e.g., the first driving electrode DRE1) may be reduced in the first emission area EA1, so that the level difference of the first pixel electrode PE1 on the insulating film may also be reduced. In other words, the level difference of the first pixel electrodes PE1 may be reduced in the first emission area EA1. As a result, light may be emitted from the first pixel PX1 in constant directions and at constant angles, and it may be possible to improve (e.g., to prevent or reduce) the white angular dependency (WAD) phenomenon in which colors on the screen may look different depending on viewing angles and viewing positions of the display device 1.

Figure 20:
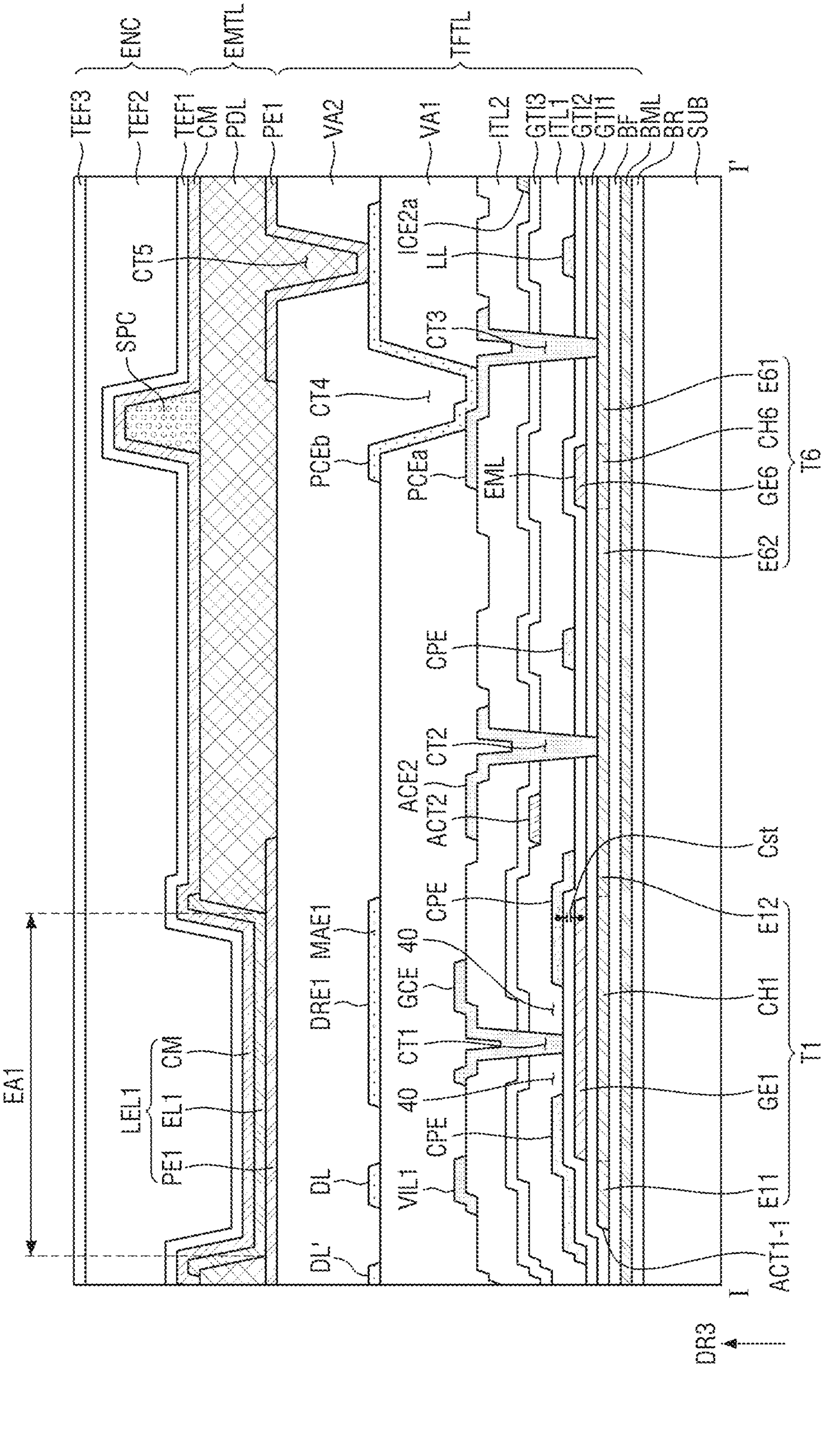
FIG. 20 is a cross-sectional view taken along the line I-I' of FIG. 5.
Figure 21:
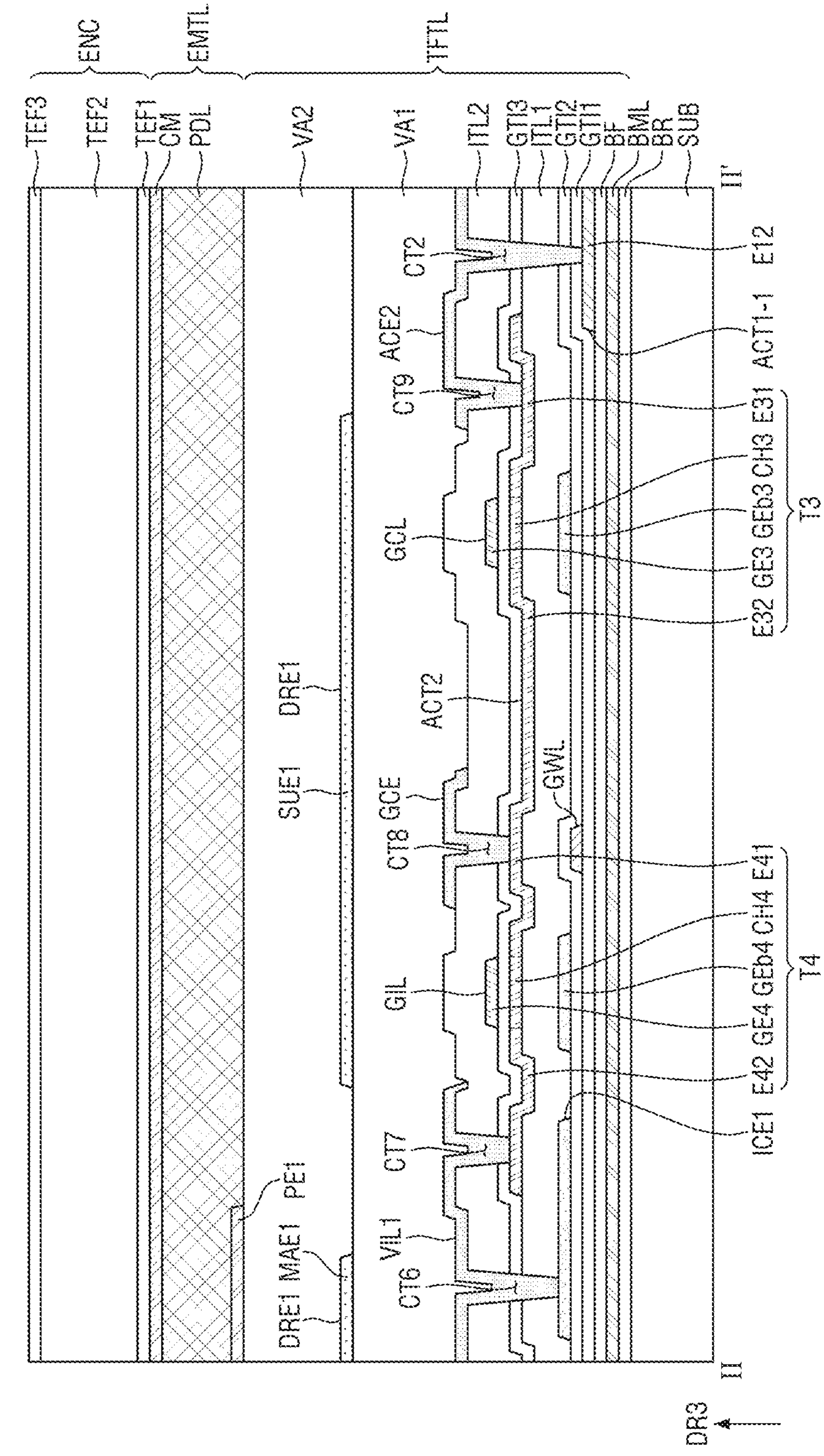
FIG. 21 is a cross-sectional view taken along the line II-II' of FIG. 5.

FIG. 20 is a cross-sectional view taken along the line I-I' of FIG. 5. FIG. 21 is a cross-sectional view taken along the line II-II' of FIG. 5.

Referring to FIG. 20, the display device 1 may include a substrate SUB, a barrier film BR, a thin-film transistor layer TFTL, an emission material layer EMTL, and an encapsulation layer ENC. The barrier film BR, the thin-film transistor layer TFTL, the emission material layer EMTL, and the encapsulation layer ENC may be sequentially disposed on the substrate SUB in the third direction DR3. The thin-film transistor layer TFTL may include the above-described pixel circuit PC (e.g., the first pixel circuit PC1).

The substrate SUB may be a rigid substrate, or a flexible substrate that may be bent, folded, rolled, and/or the like. The substrate SUB may be made of an insulating material, such as glass, quartz, and/or a polymer material (e.g., a polymer resin). Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a suitable combination thereof. As another example, the substrate SUB may include a metal material.

The substrate SUB may include, for example, a first base layer, a barrier film (e.g., a first barrier film), and a second base layer, which may be sequentially stacked on one another in the third direction DR3.

As shown in FIGS. 20 and 21, a barrier film BR (e.g., a second barrier film) may be disposed on the substrate SUB. The barrier film BR may be disposed on the entire or substantially entire surface of the substrate SUB. The barrier film BR may be a film for protecting the thin-film transistors T1 to T8 of the thin-film transistor layer TFTL and an emissive layer of the emission material layer EMTL from moisture permeating through the substrate SUB that may be vulnerable to moisture. The barrier film BR may be made up of multiple inorganic films stacked on one another alternately. For example, the barrier film BR may be made up of multiple layers in which one or more inorganic layers from among a silicon nitride layer, a silicon oxynitride layer, a silicon oxide layer, a titanium oxide layer, and an aluminum oxide layer are alternately stacked on one another.

A light-blocking layer BML may be disposed on the barrier film BR. For example, the light-blocking layer BML may be disposed in line with the first gate electrode GE1 in the first display area DA1, and may be disposed in the second display area DA2 except for in the transmissive areas TA. The light-blocking layer BML may be formed of, for example, a metal material, such as chromium (Cr) and/or molybdenum (Mo), or a black ink or a black dye. When the light-blocking layer BML is made of the metal material, the light-blocking layer BML may receive a constant or substantially constant power source. Accordingly, the light-blocking layer BML may not be electrically floating, and electrical characteristics of the transistors on the light-blocking layer BML may be stabilized. The light-blocking layer BML in the second display area DA2 may prevent light output from the electronic component from being incident on the pixel circuits PC. As such, it may be possible to prevent or substantially prevent the degradation of the oxide-based third and fourth transistors T3 and T4, for example. For example, an oxide semiconductor may be sensitive to light, and thus, there may be a change in the amount of electric current or the like due to external light.

A buffer film BF may be disposed on the light-blocking layer BML. The buffer film BF may be disposed on the entire or substantially entire surface of the substrate SUB and the barrier film BR. The buffer film BF may be a film for protecting the thin-film transistors T1 to T8 of the thin-film transistor layer TFTL and the emissive layer of the emission material layer EMTL from moisture permeating through the substrate SUB that may be vulnerable to moisture. The buffer film BF may be made up of multiple inorganic films stacked on one another alternately. For example, the buffer layer BF may be made up of multiple layers in which one or more inorganic layers from among a silicon nitride layer, a silicon oxynitride layer, a silicon oxide layer, a titanium oxide layer, and an aluminum oxide layer are alternately stacked on one another.

The first conductive layer 111 may be disposed on the buffer film BF. For example, the (1-1) active layer ACT1-1, the (1-2) active layer ACT1-2, and the (1-3) active layer ACT1-3 may be disposed on the barrier film BR. In the example shown in FIGS. 20 and 21, the (1-1) active layer ACT1-1 is disposed on the buffer film BF. As shown in FIG. 20, the (1-1) active layer ACT1-1 may include the first electrode E11 of the first transistor T1, the second electrode E12 of the first transistor T1, the first channel region CH1 of the first transistor T1, the first electrode E61 of the sixth transistor T6, the second electrode E62 of the sixth transistor T6, and the sixth channel region CH6 of the sixth transistor T6.

The (1-1) active layer ACT1-1 and (1-2) active layer ACT1-2 may be active layers made of low-temperature polycrystalline silicon (LTPS).

A first gate insulator GTI1 may be disposed on the first conductive layer 111. For example, as shown in FIGS. 20 and 21, the first gate insulator GTI1 may be disposed on the (1-1) active layer ACT1-1. The first gate insulator GTI1 may be disposed on the entire surface of the substrate SUB including the (1-1) active layer ACT1-1 and the (1-2) active layer ACT1-2.

The first gate insulator GTI1 may include at least one of tetraethoxysilane (TetraEthyl OrthoSilicate, TEOS), silicon nitride (SiNx), or silicon oxide ($SiO_2$). For example, the first gate insulator GTI1 may have a double layered structure in which a silicon nitride film having a thickness of 40 nm and a tetraethoxysilane layer having a thickness of 80 nm are stacked on one another.

The second conductive layer 222 may be disposed on the first gate insulator GI1. For example, a fourth gate line GBL, an emission control line EML, a first gate line GWL, and a first gate electrode GE1 may be disposed on the first gate insulator GTI1. In the example shown in FIGS. 20 and 21, the first gate electrode GE1, the emission control line EML, and the first gate line GWL are disposed on the first gate insulator GTI1. The first gate electrode GE1 may be disposed on the first gate insulator GTI1 to overlap with the first channel region CH1 of the (1-1) active layer ACT1-1. The sixth gate electrode GE6 of the emission control line EML may be disposed on the first gate insulator GTI1 to overlap with the sixth channel region CH6 of the (1-1) active layer ACT1-1. The second conductive layer 222 may include molybdenum (Mo), copper (Cu), titanium (Ti), and/or the like, and may be made up of a single layer or multiple layers.

A second gate insulator GTI12 may be disposed on the second conductive layer 222. For example, as shown in FIGS. 20 and 21, the second gate insulator GTI12 may be disposed on the first gate electrode GE1, the emission control line EML, and the first gate line GWL. The second gate insulator GTI2 may be disposed on the entire surface of the substrate SUB, and on the first gate electrode GE1, the sixth gate electrode GE6, and the first gate line GWL.

The second gate insulator GTI2 may have the same material and structure as those of the first gate insulator GTI1 described above.

The third conductive layer 333 may be disposed on the second gate insulator GTI2. For example, on the second gate insulator GTI2, a lower bias connection electrode BCEa, a connection line LL, a capacitor electrode CPE, a third counter gate electrode GEb3, a fourth counter gate electrode GEb4, and a first initialization connection electrode ICE1 may be disposed. In the example shown in FIGS. 20 and 21, the capacitor electrode CPE, the connection line LL, the first initialization connection electrode ICE1, the fourth counter gate electrode GEb4, and the third counter gate electrode GEb3 are disposed on the second gate insulator GTI2. The capacitor electrode CPE may be disposed on the second gate insulator GTI2 to overlap with the first gate electrode GE1.

The third conductive layer 333 may have the same material or structure as those of the above-described second conductive layer 222.

A first interlayer dielectric film ITL1 may be disposed on the third conductive layer 333. For example, as shown in FIGS. 20 and 21, the first interlayer dielectric film ITL1 may be disposed on the capacitor electrode CPE, the connection line LL, the first initialization connection electrode ICE1, the fourth counter gate electrode GEb4, and the third counter gate electrode GEb3. The first interlayer dielectric film ITL1 may be disposed on the entire surface of the substrate SUB, and on the capacitor electrode CPE, the connection line LL, the first initialization connection electrode ICE1, the fourth counter gate electrode GEb4, and the third counter gate electrode GEb3.

The first interlayer dielectric film ITL1 may include an inorganic film, for example, such as a silicon nitride layer, a silicon oxynitride layer, a silicon oxide layer, a titanium oxide layer, or an aluminum oxide layer. The first interlayer dielectric film ITL1 may include a plurality of inorganic films.

The fourth conductive layer 444 may be disposed on the first interlayer dielectric film ITL1. For example, as shown in FIGS. 20 and 21, the second active layer ACT2 may be disposed on the first interlayer dielectric film ITL1. As shown in FIG. 21, the second active layer ACT2 may be disposed on the first interlayer dielectric film ITL1 to overlap with the third counter gate electrode GEb3 and the fourth counter gate electrode GEb4. The second active layer ACT2 may include the first electrode E31 of the third transistor T3, the second electrode E32 of the third transistor T3, the third channel region CH3 of the third transistor T3, the first electrode E41 of the fourth transistor T4, the second electrode E42 of the fourth transistor T4, and the fourth channel region CH4 of the fourth transistor T4. The third channel region CH3 of the second active layer ACT2 may overlap with the third counter gate electrode GEb3, and the fourth channel region CH4 of the second active layer ACT2 may overlap with the fourth counter gate electrode GEb4.

The second active layer ACT2 may be an oxide-based active layer. For example, the second active layer ACT2 may be an oxide semiconductor that includes indium-gallium-zinc-oxide (IGZO) or indium-gallium-zinc-tin oxide (IG-ZTO).

A third gate insulator GTI3 may be disposed on the fourth conductive layer 444. For example, as shown in FIGS. 20 and 21, the third gate insulator GTI3 may be disposed on the second active layer ACT2. The third gate insulator GTI3 may be disposed on the entire surface of the substrate SUB, and on the second active layer ACT2.

The third gate insulator GTI3 may have the same material and structure as those of the first gate insulator GTI1 described above.

The fifth conductive layer 555 may be disposed on the third gate insulator GTI3. For example, a bias voltage line VBL, a second lower initialization connection electrode ICE2*a*, a second gate line GCL, and a third gate line GIL may be disposed on the third gate insulator GTI3. In the example shown in FIGS. 20 and 21, the second lower initialization connection electrode ICE2*a*, the third gate line GIL, and the second gate line GCL are disposed on the third gate insulator GTI3. The fourth gate electrode GE4 of the third gate line GIL may overlap with the fourth channel region CH4 of the second active layer ACT2. The third gate electrode GE3 of the second gate line GCL may overlap with the third channel region CH3 of the second active layer ACT2.

The fifth conductive layer 555 may have the same material or structure as those of the above-described second conductive layer 222.

A second interlayer dielectric film ITL2 may be disposed on the fifth conductive layer 555. For example, as shown in FIGS. 20 and 21, the second interlayer dielectric film ITL2 may be disposed on the second lower initialization connection electrode ICE2*a*, the third gate line GIL, and the second gate line GCL.

The second interlayer dielectric film ITL2 may be disposed on the entire surface of the substrate SUB, and on the second lower initialization connection electrode ICE2*a*, the third gate line GIL, and the second gate line GCL.

The second interlayer dielectric film ITL2 may have the same material and structure as those of the first interlayer dielectric film ITL1 described above.

The sixth conductive layer 666 may be disposed on the second interlayer dielectric film ITL2. For example, the upper bias connection electrode BCEb, the second upper initialization connection electrode ICE2*b*, the first active connection electrode ACE1, the lower pixel connection electrode PCEa, the capacitor connection electrode CCE, the second active connection electrode ACE2, the gate connection electrode GCE, the data connection electrode DCE, and the first initialization voltage line VIL1 may be disposed on the second interlayer dielectric film ITL2. In the example shown in FIGS. 20 and 21, the first initialization voltage line VIL1, the gate connection electrode GCE, the second active connection electrode ACE2, the lower pixel connection electrode PCEa, and the first initialization voltage line VIL1 are disposed on the second interlayer dielectric film ITL2. The gate connection electrode GCE may be connected to the first gate electrode GE1 through a first contact hole CT1 penetrating the second interlayer dielectric film ITL2, the third gate insulator GTI3, the first interlayer insulating film ITL1, the hole 40 of the capacitor electrode CPE, and the second gate insulator GTI2. In addition, the gate connection electrode GCE may be connected to the first electrode E41 of the fourth transistor T4 and the second electrode E32 of the third transistor T3 through an eighth contact hole CT8 penetrating through the second interlayer dielectric film ITL2 and the third gate insulator GTI3. The second active connection electrode ACE2 may be connected to the second electrode E11 of the first transistor T1 and the second electrode E62 of the sixth transistor T6 through a second contact hole CT2 penetrating through the second interlayer dielectric film ITL2, the third gate insulator GTI3, the first interlayer dielectric film ITL1, the second gate insulator film GTI2, and the first gate insulator GTI1. In addition, the second active connection electrode ACE2 may be connected to the first electrode E31 of the third transistor T3 through a ninth contact hole CT9 penetrating through the second interlayer dielectric film ITL2 and the third gate insulator GTI3. The lower pixel connection electrode PCEa may be connected to the first electrode E61 of the sixth transistor T6 through a third contact hole CT3 penetrating through the second interlayer dielectric film ITL2, the third gate insulator GTI3, the first interlayer dielectric film ITL1, the second gate insulator GTI2, and the first gate insulator GTI1. The first initialization voltage line VIL1 may be connected to the first initialization connection electrode ICE1 through a sixth contact hole CT6 penetrating through the second interlayer dielectric film ITL2, the third gate insulator GTI3, and the first interlayer dielectric film ITL1. In addition, the first initialization voltage line VIL1 may be connected to the second electrode E42 of the fourth transistor T4 through a seventh contact hole CT7 penetrating through the second interlayer dielectric film ITL2 and the third gate insulator GTI3. The first contact hole CT1, the second contact hole CT2, the third contact hole CT3, the sixth contact hole CT6, the seventh contact hole CT7, the eighth contact hole CT8, and the ninth contact hole CT9 may belong to the second-type contact holes CTb.

The sixth conductive layer 666 may have the same material or structure as those of the above-described second conductive layer 222.

The first planarization film VA1 may be disposed on the sixth conductive layer 666. For example, the first planarization film VA1 may be disposed on the first initialization voltage line VIL1, the gate connection electrode GCE, the second active connection electrode ACE2, and the lower pixel connection electrode PCEa. The first planarization film VA1 may be disposed on the entire surface of the substrate SUB, and on the first initialization voltage line VIL1, the gate connection electrode GCE, the second active connection electrode ACE2, and the lower pixel connection electrode PCEa.

The first planarization film VA1 may include an organic film, such as an acryl resin, an epoxy resin, a phenolic resin, a polyamide resin, and/or a polyimide resin.

The seventh conductive layer 777 may be disposed on the first planarization film VA1. For example, the first data line DL1, the first driving electrode DRE1, and the upper pixel connection electrode PCEb may be disposed on the first planarization film VA1. In the example shown in FIGS. 20 and 21, the data lines DL' and DL1, the first driving electrode DRE1, and the upper pixel connection electrode PCEb are disposed on the first planarization film VA1.

The upper pixel connection electrode PCEb may be connected to the lower pixel connection electrode PCEa through a fourth contact hole CT4 of the first planarization film VA1. The fourth contact hole CT4 may belong to the third-type contact holes CTc. The first main electrode MAE1 of the first driving electrode DRE1 may overlap with the gate connection electrode GCE. The first sub-electrode SUE1 of the first driving electrode DRE1 may overlap with the third transistor T3 and the fourth transistor T4. For example, as shown in FIG. 21, the first sub-electrode SUE1 may overlap with the third channel region CH3 of the third transistor T3 and the fourth channel region CH4 of the fourth transistor T4 to cover the channel regions CH3 and CH4. Accordingly, the first sub-electrode SUE1 may prevent or substantially prevent external light from being incident on the oxide semiconductor-based third and fourth transistors T3 and T4. In addition, as shown in FIGS. 5 and 20, because the first initialization voltage line VIL1 is disposed between the first data line DL1 and the gate connection electrode GCE when viewed from the top (e.g., in a plan view), it may be possible to prevent or substantially prevent coupling between the gate connection electrode GCE and the first data line DL1. In other words, the first initialization voltage line VIL1 may prevent or substantially prevent the coupling between the gate connection electrode GCE and the first data line DL1, and thus, may prevent or substantially prevent the voltage of the first data line DL1 from being varied. Therefore, it may be possible to prevent or substantially prevent the voltage of the first data line DL1 from being varied, even though there is the gap between the first main electrode MAE1 and the first sub-electrode SUE1 in the emission area, in order to reduce the level difference as described above.

The seventh conductive layer 777 may have the same material or structure as those of the above-described second conductive layer 222.

A second planarization film VA2 may be disposed on the seventh conductive layer 777. For example, the second planarization film VA2 may be disposed on the first data line DL1, the first driving electrode DRE1, and the upper pixel connection electrode PCEb. The second planarization film VA2 may be disposed on the entire surface of the substrate SUB, and on the first data line DL1, the first driving electrode DRE1, and the upper pixel connection electrode PCEb.

The second planarization film VA2 may include the same material and structure as those of the first planarization film VA1 described above.

The eighth conductive layer 888 may be disposed on the second planarization film VA2. For example, as shown in FIGS. 20 and 21, the emission material layer EMTL including the eighth conductive layer 888 may be disposed on the second planarization film VA2. As shown in FIG. 20, the first pixel electrode PE1 may be disposed on the third planarization film VA3 as part of the eighth conductive layer 888. The first pixel electrode PE1 may be connected to the upper pixel connection electrode PCEb through a fifth contact hole CT5 penetrating through the second planarization film VA2. The fifth contact hole CT5 may belong to the fourth-type contact holes CTd.

The emission material layer EMTL described above may further include a plurality of light-emitting elements LEL and a bank PDL (e.g., a pixel-defining film), in addition to the eighth conductive layer 888.

The light-emitting elements LEL may include, for example, a first light-emitting element LEL1, a second light-emitting element, and a third light-emitting element. The first light-emitting element LEL1 may include the first pixel electrode PE1, a first emissive layer EL1, and a common electrode CM. The second light-emitting element may include the second pixel electrode PE2, a second emissive layer, and the common electrode CM. The third light-emitting element may include the third pixel electrode PE3, a third emissive layer, and the common electrode CM.

As described above, the first light-emitting element LEL1 may include the first pixel electrode PE1, the first emissive layer EL1, and the common electrode CM. In the first emission area EA1, the first pixel electrode PE1, the first emissive layer EL1, and the common electrode CM are stacked on one another sequentially, so that holes from the first pixel electrode PE1 and electrons from the common electrode CM are combined with each other in the first emissive layer EL1 to emit light. The first pixel electrode PE1 may be an anode electrode of the first light-emitting element LEL1, and the common electrode CM may be a cathode electrode of the first light-emitting element LEL1.

In a top-emission structure where light exits from the first emissive layer EL1 toward the common electrode CM, the first pixel electrode PE1 may be made up of a single layer of molybdenum (Mo), titanium (Ti), copper (Cu), or aluminum (Al), or may be made up of a stacked structure of aluminum and titanium (Ti/Al/Ti), a stacked structure of aluminum and ITO (ITO/Al/ITO), an APC alloy, and/or a stacked structure of the APC alloy and ITO (ITO/APC/ITO) in order to increase reflectivity. The APC alloy may be an alloy of silver (Ag), palladium (Pd), and copper (Cu).

The bank PDL (e.g., a pixel-defining film) may define the emission areas EA1, EA2, and EA3 of the pixels PX1, PX2, and PX3. The bank PDL may be disposed on the second planarization film VA2 to expose partial regions of the first pixel electrode PE1, the second pixel electrode PE2, and the third pixel electrode PE3. The bank PDL may cover edges of the first pixel electrode PE1, the second pixel electrode PE2, and the third pixel electrode PE3. The bank PDL may be disposed in the fifth contact hole CT5 penetrating the second planarization film VA2. Accordingly, the fifth contact hole CT5 penetrating the second planarization film VA2 may be filled with the bank PDL. The bank PDL may be formed of an organic layer, such as an acryl resin, an epoxy resin, a phenolic resin, a polyamide resin, and/or a polyimide resin.

As shown in FIG. 20, a spacer SPC may be disposed on the bank PDL. The spacer SPC may support a mask during a process of fabricating an emissive layer (e.g., the first emissive layer EL1). The spacer SPC may be formed of an organic layer, such as an acryl resin, an epoxy resin, a phenolic resin, a polyamide resin, and/or a polyimide resin.

The first emissive layer EL1 may be formed on the first pixel electrode PE1. The first emissive layer EL1 may include an organic material, and may emit light of a suitable color (e.g., a predetermined color). For example, the first emissive layer EL1 may include a hole transporting layer, an organic material layer, and an electron transporting layer. The organic material layer may include a host and a dopant. The organic material layer may include a suitable material that emits a suitable color light (e.g., a predetermined light), and may be formed using a phosphor or a fluorescent material.

For example, the organic material layer of the first emissive layer EL1 of the first emission area EA1, which emits light of the first color (e.g., blue color), may be, but is not limited to, a phosphor that includes a host material including CBP or mCP, and a dopant material including (4,6-F2ppy)2Irpic or L2BD111.

The organic material layer of the second emissive layer of the second emission area EA2, which emits light of the second color (e.g., green color), may be a phosphor that includes a host material including CBP or mCP, and a dopant material including ir(ppy)3(fac tris(2-phenylpyridine) iridium). As another example, the organic material layer of the second emissive layer of the second emission area EA2 for emitting light of the second color may be, but is not limited to, a fluorescent material including Alq3(tris(8-hydroxyquinolino)aluminum).

The organic material layer of the emissive layer in the third emission area EA3 that emits light of the third color (e.g., red color) may be a phosphor that includes a host material including carbazole biphenyl (CBP) or mCP(1,3-bis (carbazol-9-yl), and a dopant including at least one selected from the group consisting of PIQIr(acac)(bis(1-phenylisoquinoline)acetylacetonate iridium), PQIr(acac)(bis (1-phenylquinoline)acetylacetonate iridium), PQIr(tris(1-phenylquinoline)iridium), and PtOEP(octaethylporphyrin platinum). As another example, the organic material layer of the third emissive layer of the third emission area EA3 may be, but is not limited to, a fluorescent material including PBD:Eu(DBM)3(Phen) or perylene.

The common electrode CM may be disposed on the first emissive layer EL1, the second emissive layer, and the third emissive layer. The common electrode CM may be disposed to cover the first, second, and third emissive layers. The common electrode CM may be a common layer disposed across the first to third emissive layers. A capping layer may be formed on the common electrode CM.

In the top-emission structure, the common electrode CM may be formed of a transparent conductive material (TCP), such as ITO and/or IZO, that may transmit light, or a semi-transmissive conductive material, such as magnesium (Mg), silver (Ag), and/or an alloy of magnesium (Mg) and silver (Ag). When the common electrode CM is formed of the semi-transmissive metal material, light extraction efficiency may be increased by using microcavities.

The encapsulation layer ENC may be formed on the emission material layer EMTL. The encapsulation layer ENC may include one or more inorganic films to prevent or substantially prevent permeation of oxygen and/or moisture into the emission material layer EMTL. In addition, the encapsulation layer ENC may include at least one organic film to protect the emission material layer EMTL from particles, such as dust. For example, the encapsulation layer ENC may include a first inorganic encapsulation film TEF1, an organic encapsulation film TEF2, and a second inorganic encapsulation film TEF3.

The first inorganic encapsulation film TEF1 may be disposed on the common electrode CM. The organic encapsulation film TEF2 may be disposed on the first inorganic encapsulation film TEF1. The second inorganic encapsulation film TEF3 may be disposed on the organic encapsulation film TEF2. The first inorganic encapsulation film TEF1 and the second inorganic encapsulation film TEF3 may be made up of multiple layers in which one or more inorganic layers from among a silicon nitride layer, a silicon oxynitride layer, a silicon oxide layer, a titanium oxide layer, and an aluminum oxide layer are alternately stacked on one another. The organic encapsulation film TEF2 may be an organic film, such as an acryl resin, an epoxy resin, a phenolic resin, a polyamide resin, a polyimide resin, and/or the like.

Figure 22:
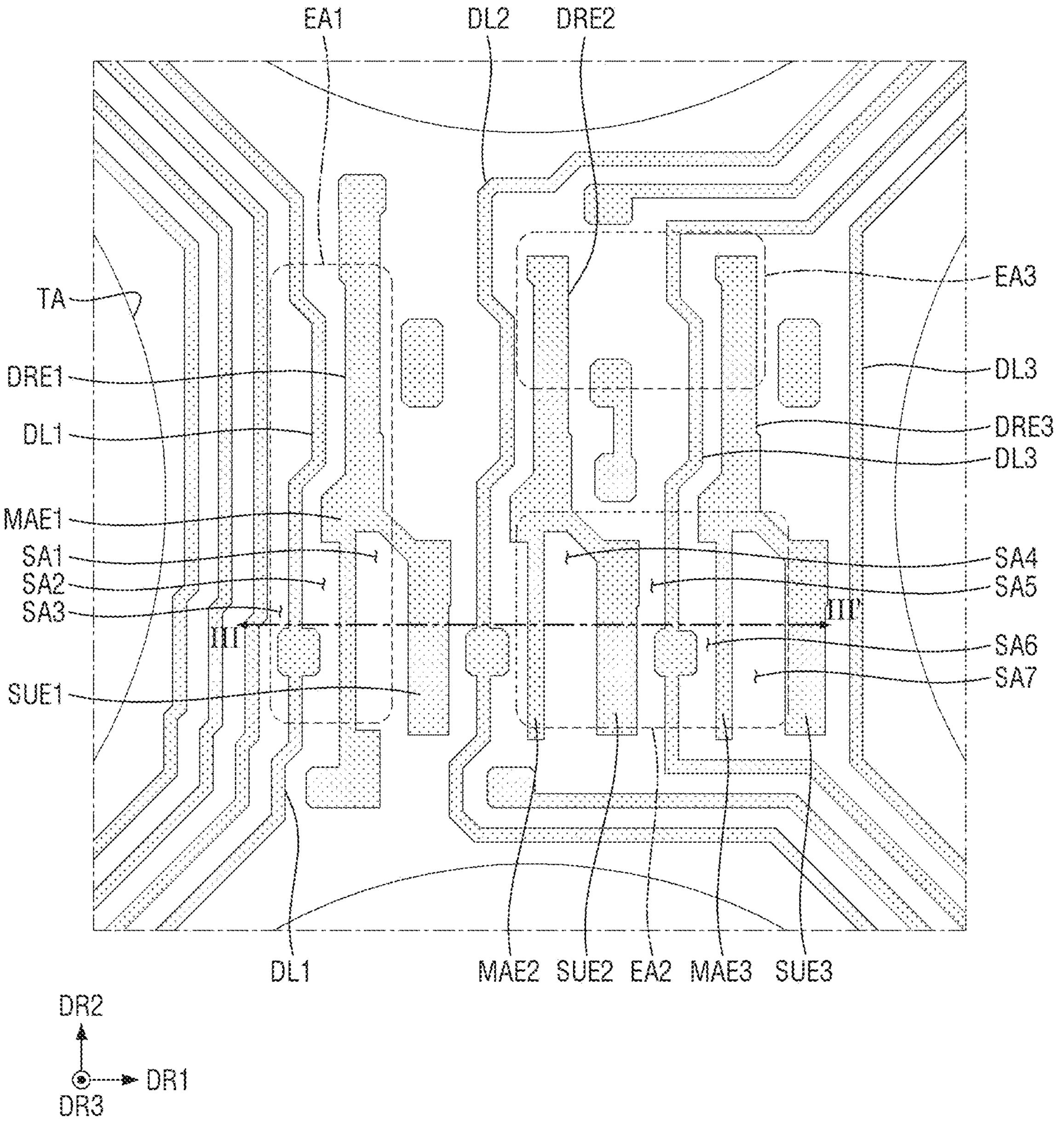
FIG. 22 is a plan view selectively showing a seventh conductive layer and emission areas from among the elements of FIG. 4A.
Figure 23:
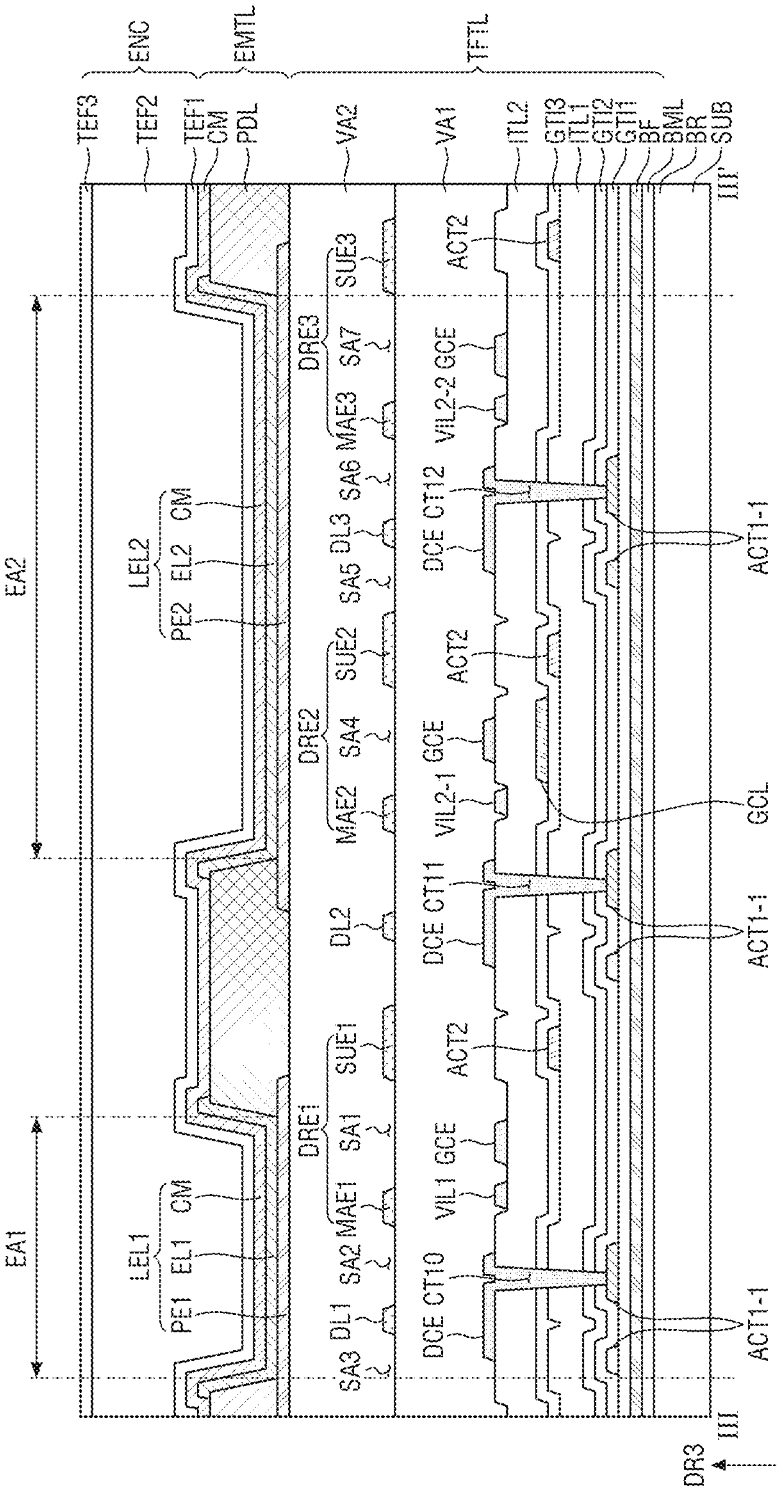
FIG. 23 is a cross-sectional view taken along the line III-III' of FIGS. 4A and 22.

FIG. 22 is a plan view selectively showing the seventh conductive layer and the emission areas from among the elements of FIG. 4A. FIG. 23 is a cross-sectional view taken along the line III-III' of FIGS. 4A and 22.

Referring to FIGS. 22 and 23, the second driving electrode DRE2 and the third driving electrode DRE3 may have a shape that is the same or substantially the same as (or similar to) that of the above-described first driving electrode DRE1. For example, the second driving electrode DRE2 may include a second main electrode MAE2, and a second sub-electrode SUE2 branched off from the second main electrode MAE2. The third driving electrode DRE3 may include a third main electrode MAE3, and a third sub-electrode SUE3 branched off from the third main electrode MAE3.

The second sub-electrode SUE2 of the second driving electrode DRE2 may be extended in a direction parallel to or substantially parallel to the direction in which the second main electrode MAE2 is extended. The second sub-electrode SUE2 may be spaced apart from the second main electrode MAE2 by a suitable distance (e.g., a predetermined distance) in the first direction DR1. Accordingly, a gap may be located between the second main electrode MAE2 and the second sub-electrode SUE2. The second emission area EA2 may be divided into two sub-emission areas with respect to the second sub-electrode SUE2. For example, in a plan view, the second sub-electrode SUE2 crosses and overlaps with the second emission area EA2 in the second direction DR2, so that the second emission area EA2 is divided into at least two sub-emission areas (e.g., along the first direction DR1). The first sub-emission area SA5 of the second emission area EA2 may be disposed on the right side of the second sub-electrode SUE2, and the second sub-emission area SA4 of the second emission area EA2 may be disposed on the left side of the second sub-electrode SUE2.

The third sub-electrode SUE3 of the third driving electrode DRE3 may be extended in a direction parallel to or substantially parallel to the direction in which the third main electrode MAE3 is extended. The third sub-electrode SUE3 may be spaced apart from the third main electrode MAE3 by a suitable distance (e.g., a predetermined distance) in the first direction DR1. Accordingly, a gap may be formed between the third main electrode MAE3 and the third sub-electrode SUE3. The second emission area EA2 may be further divided into two sub-emission areas with respect to the third main electrode MAE3. For example, in a plan view, the third main electrode MAE3 crosses and overlaps with the second emission area EA2 in the second direction DR2, so that the second emission area EA2 is further divided into at least two sub-emission areas (e.g., along the first direction DR1). A third sub-emission area SA7 of the second emission area EA2 may be disposed on the right side of the third main electrode MAE3, and a fourth sub-emission area SA6 of the second emission area EA2 may be disposed on the left side of the third main electrode MAE3.

A third data line DL3 crosses and overlaps with the second emission area EA2 between the second sub-electrode SUE2 and the third main electrode MAE3, and accordingly, the second emission area EA2 may be further divided by the second data line DL2. For example, the second emission area EA2 may be defined as four sub-emission areas SA4, SA5, SA6, and SA7 by the second main electrode MAE2, the gap (e.g., the gap between the second main electrode MAE2 and the second sub-electrode SUE2), the second data line DL2, the third main electrode MAE3, and the gap (e.g., the gap between the third main electrode MAE3 and the third sub-electrode SUE3). Accordingly, the level difference of the insulating film (e.g., the first planarization film VA1) disposed on the seventh conductive layer 777 (e.g., the second driving electrode DRE2 and the third driving electrode DRE3) in the first direction DR1 in the second emission area EA2 may be reduced, so that the level difference of the second pixel electrode PE2 on the insulating film may be reduced as well. In other words, the level difference of the second pixel electrodes PE2 may be reduced in the second emission area EA2. As a result, light may be emitted from the second pixel PX2 in constant directions and at constant angles, and it may be possible to improve the white angular dependency (WAD) phenomenon in which colors on the screen may look different depending on viewing angles and viewing positions of the display device.

In addition, because the second data line DL2 is disposed between the first sub-electrode SUE1 of the first driving electrode DRE1 and the second main electrode MAE2 of the second driving electrode DRE2, the level difference at the edge of the second emission area EA2 and the edge of the third emission area EA3 may be reduced as well.

In other words, because each of the first driving electrode DRE1, the second driving electrode DRE2, and the third driving electrode DRE3 includes a main electrode and a sub-electrode, and has a gap between the main electrode and the sub-electrode, the first data line DL1, the first main electrode MAE1, the first sub electrode SUE1, the second data line DL2, the second main electrode MAE2, the second sub-electrode SUE2, the third data line DL3, the third main electrode MAE3, and the third sub-electrode SUE3 may be evenly or substantially evenly distributed with similar areas and similar spacing between the left edge of the first emission area EA1 and the right edge of the emission area EA2, as shown in FIG. 23. As such, the level difference of the first pixel electrode PE1 and the second pixel electrode PE2 may be reduced in the first emission area EA1 and the second emission area EA2 disposed on the second planarization film VA2 over the second conductive layer 777.

The unit pixel of the first display area DA1 may also include the first driving electrode DRE1, the second driving electrode DRE2, and the third driving electrode DRE3 having the same or substantially the same structure as that shown in FIG. 4A, and thus, redundant description thereof is not repeated.

Figure 24:
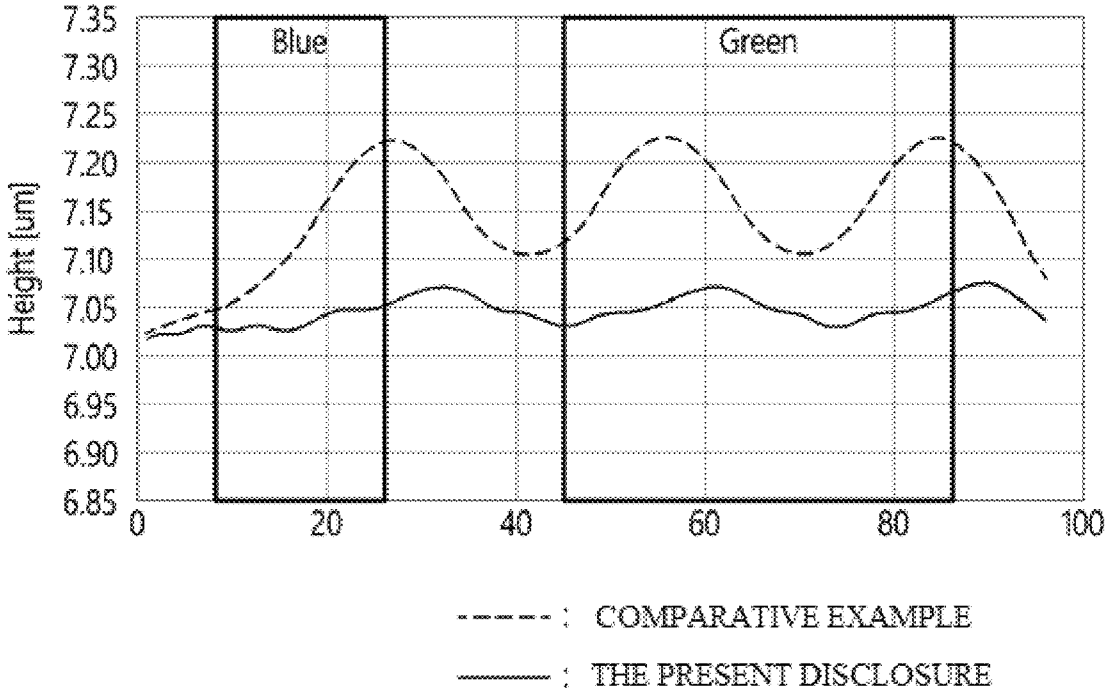
FIG. 24 is a graph illustrating thicknesses of display devices.

FIG. 24 is a graph illustrating thicknesses of display devices.

In FIG. 24, the x-axis represents a portion of the display device 1 cut along the line III-III' of FIG. 4A, and the y-axis represents the height (e.g., in a thickness direction or the third direction DR3) thereof.

The flatness is measured based on the cross-sectional view taken along the line III-III' of FIG. 4A. As shown in FIG. 24, the display device 1 according to one or more embodiments of the present disclosure may have improved flatness than that of the Comparative Example. The Comparative Example may have, for example, an I-shape in which each driving electrode has no gap.

Hereinafter, other structures of a light-emitting element (e.g., the light-emitting element LEL1 of FIG. 20) will be described in more detail with reference to FIGS. 25 through 32.

Figure 25:
FIG. 25 is a cross-sectional view showing a structure of a display element according to an embodiment of the present disclosure.

FIG. 25 is a cross-sectional view showing a structure of a display element according to an embodiment of the present disclosure. FIGS. 26 through 29 are cross-sectional views illustrating structures of light-emitting elements according to embodiments of the present disclosure.

Referring to FIG. 25, a light-emitting element (e.g., an organic light-emitting diode) according to an embodiment may include a pixel electrode 201, a common electrode 205, and an intermediate layer 203 between the pixel electrode 201 and the common electrode 205.

The pixel electrode 201 may include a transparent conductive oxide, such as indium tin oxide (ITO), indium zinc oxide (IZO), zinc oxide (ZnO), indium oxide ($In_2O_3$), indium gallium oxide (IGO), and/or aluminum zinc oxide (AZO). The pixel electrode 201 may include a reflective layer containing silver (Ag), magnesium (Mg), aluminum (Al), platinum (Pt), palladium (Pd), gold (Au), nickel (Ni), neodymium (Nd), iridium (Ir), chrome (Cr), or a suitable compound thereof. For example, the pixel electrode 201 may have a three-layered structure of ITO/Ag/ITO.

The common electrode 205 may be disposed on the intermediate layer 203. The common electrode 205 may include a metal having a low work function, an alloy, an electrically conductive compound, or any suitable combination thereof. For example, the common electrode 205 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any suitable combination thereof. The common electrode 205 may be a transmissive electrode, a transflective electrode, or a reflective electrode.

The intermediate layer 203 may include a polymer or a low molecular weight organic material that emits light of a suitable color (e.g., a predetermined color). In addition to a variety of organic materials, the intermediate layer 203 may further include one or more metal-containing compounds, such as organometallic compounds, one or more inorganic materials, such as quantum dots, and/or the like.

According to the present embodiment, the intermediate layer 203 may include an emissive layer, and a first functional layer and a second functional layer disposed under and over the emissive layer, respectively. The first functional layer may include, for example, a hole transport layer HTL, or may include a hole transport layer and a hole injection layer HIL. The second functional layer is an optional element disposed on the emissive layer. For example, the intermediate layer 203 may or may not include the second functional layer. The second functional layer may include an electron transport layer ETL and/or an electron injection layer EIL.

According to the present embodiment, the intermediate layer 203 may include two or more emitting units sequentially stacked between the pixel electrode 201 and the common electrode 205, and a charge generation layer CGL disposed between the two emitting units. When the intermediate layer 203 includes the emitting units and the charge generation layer, the light-emitting element (e.g., the organic light-emitting diode) may have a tandem structure. The light-emitting element (e.g., the organic light-emitting diode) may improve color purity and emission efficiency by employing a stacked structure of a plurality of emitting units.

One emitting unit may include an emissive layer, and a first functional layer and a second functional layer disposed under and over the emissive layer, respectively. The charge generation layer CGL may include a negative charge generation layer and a positive charge generation layer. The emission efficiency of the organic light-emitting diode, which is a tandem light-emitting element having a plurality of emissive layers, may be further increased by the negative charge generating layer and the positive charge generating layer.

The negative charge generation layer may be an n-type charge generation layer. The negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

Figure 26:
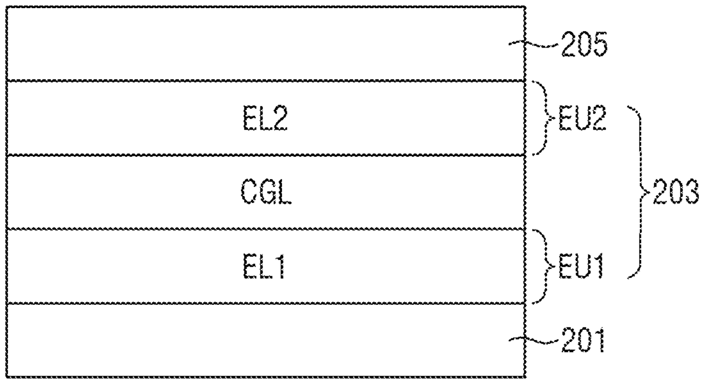
FIGS. 26-29 are cross-sectional views illustrating structures of light-emitting elements according to embodiments of the present disclosure.

According to an embodiment, as shown in FIG. 26, the light-emitting element (e.g., an organic light-emitting diode) may include a first emitting unit EU1 including a first emissive layer EL1, and a second emitting layer EL2 including a second emissive layer EL2 stacked on one another. The charge generation layer CGL may be disposed between the first emitting unit EU1 and the second emitting unit EU2. For example, the light-emitting element (e.g., the organic light-emitting diode) may include the pixel electrode 201, a first emissive layer EL1, a charge generation layer CGL, a second emissive layer EL2, and the common electrode 205 sequentially stacked on one another. A first functional layer and a second functional layer may be disposed under and over the first emissive layer EL1, respectively. A first functional layer and a second functional layer may be disposed under and over the second emissive layer EL2, respectively. The first emissive layer EL1 may be a blue emissive layer, and the second emissive layer EL2 may be a yellow emissive layer.

Figure 27:
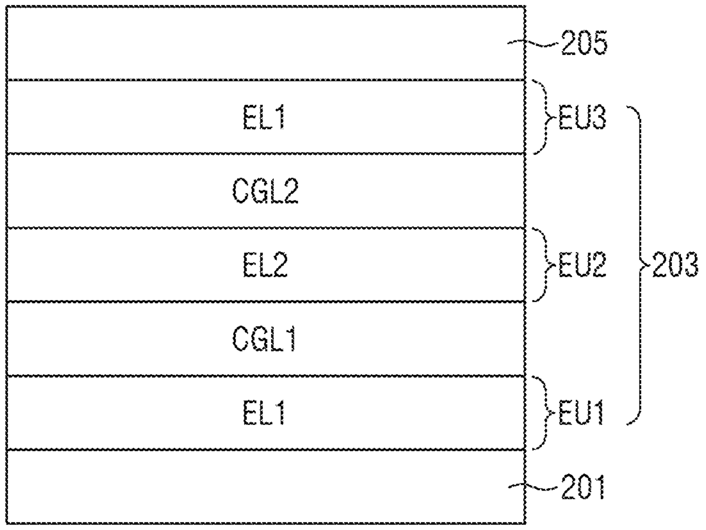

According to an embodiment, as shown in FIG. 27, the light-emitting element (e.g., an organic light-emitting diode) may include a first emitting unit EU1 including a first emissive layer EL1, a third light-emitting unit EU3, and a second emitting layer EL2 including a second emissive layer EL2. The first charge generation layer CGL1 may be disposed between the first emitting unit EU1 and the second emitting unit EU2, and the second charge generation layer CGL2 may be disposed between the second emitting unit EU2 and the third emitting unit EU3. For example, the light-emitting element (e.g., the organic light-emitting diode) may include the pixel electrode 201, a first emissive layer EL1, a first charge generation layer CGL1, a second emissive layer EL2, a second charge generation layer CGL2, a first emissive layer EL1, and the common electrode 205, which are stacked on one another in this order. A first functional layer and a second functional layer may be disposed under and over the first emissive layer EL1, respectively. A first functional layer and a second functional layer may be disposed under and over the second emissive layer EL2, respectively. The first emissive layer EL1 may be a blue emissive layer, and the second emissive layer EL2 may be a yellow emissive layer.

According to an embodiment of the present disclosure, the second emitting unit EU2 of the light-emitting element (e.g., the organic light-emitting diode) may further include a third emitting layer EL3 and/or a fourth emitting layer EL4 in direct contact with the second emitting unit EU2 under and/or over the second emitting layer EL2, in addition to the second emitting layer EL2. As used herein, the phrase "the third emitting layer EL3 and/or the fourth emitting layer EL4 are in direct contact with the second emitting unit EU2" means that no other layer is disposed between the second emitting layer EL2 and the third emitting layer EL3 and/or between the second emitting layer EL2 and the fourth emitting layer EL4. The third emissive layer EL3 may be a red emissive layer, and the fourth emissive layer EL4 may be a green emissive layer.

Figure 28:
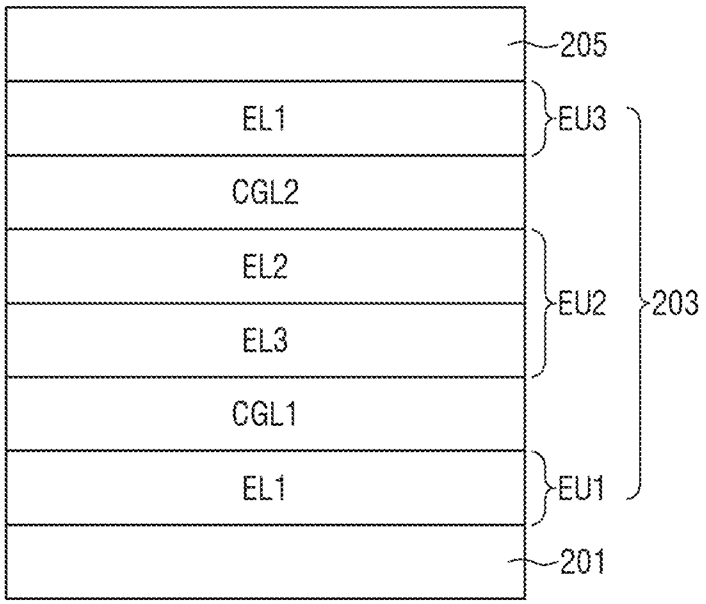
Figure 29:
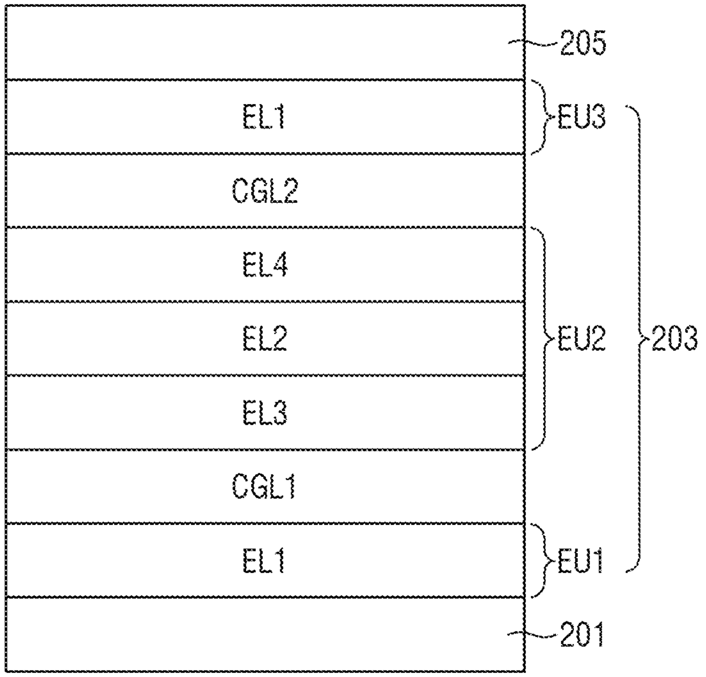

For example, as shown in FIG. 28, the light-emitting element (e.g., organic light-emitting diode) may include the pixel electrode 201, a first emissive layer EL1, a first charge generation layer CGL1, a third emissive layer EL3, a second emissive layer EL2, a second charge generation layer CGL2, a first emissive layer EL1, and the common electrode 205, which are stacked on one another in this order. As another example, as shown in FIG. 29, the light-emitting element (e.g., the organic light-emitting diode) may include the pixel electrode 201, a first emissive layer EL1, a first charge generation layer CGL1, a third emissive layer EL3, a second emissive layer EL2, a fourth emissive layer EL4, a second charge generation layer CGL2, a first emissive layer EL1, and the common electrode 205, which are stacked on one another in this order.

Figure 30:
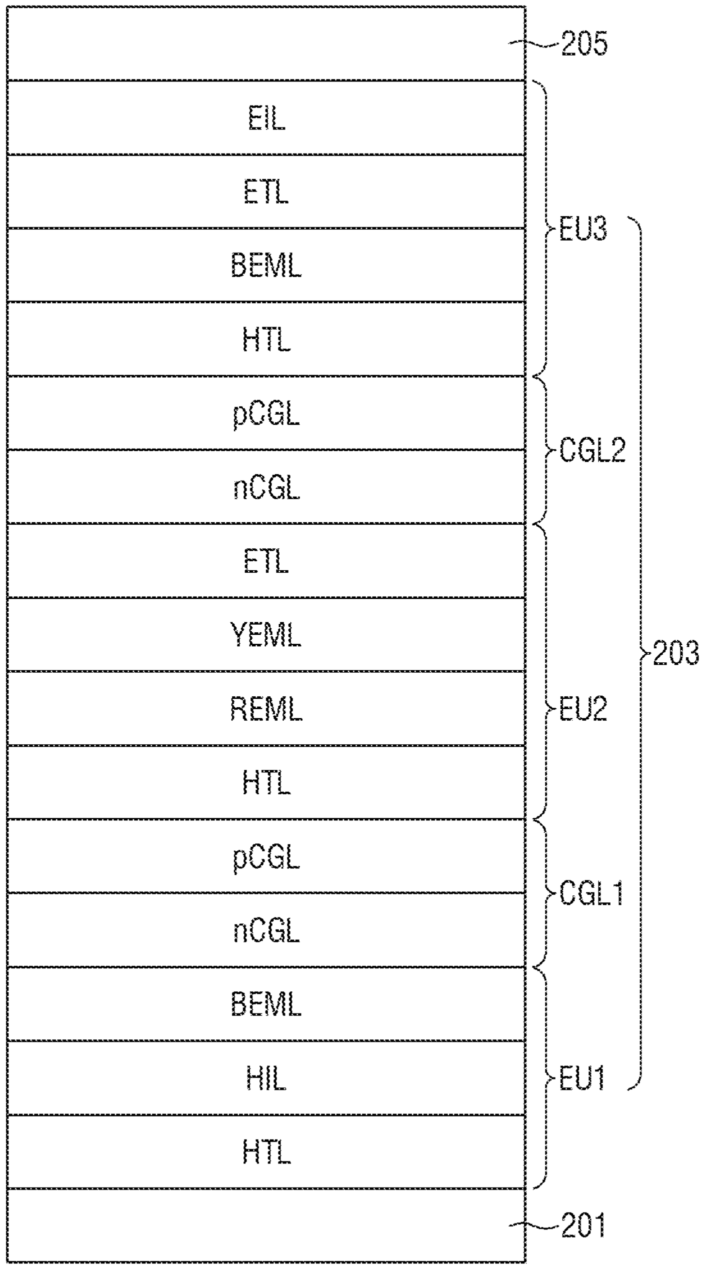
FIG. 30 is a cross-sectional view showing an example of the organic light-emitting diode of FIG. 28.
Figure 31:
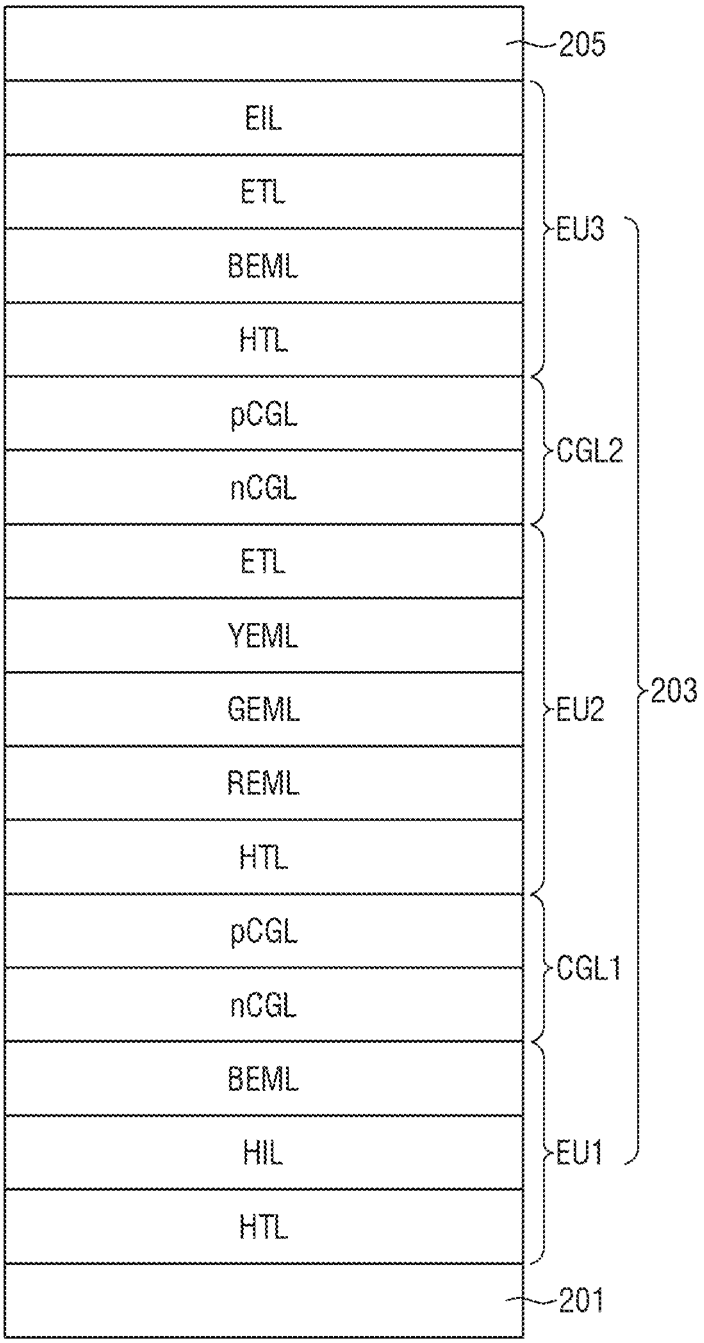
FIG. 31 is a cross-sectional view showing an example of the organic light-emitting diode of FIG. 29.

FIG. 30 is a cross-sectional view showing an example of the organic light-emitting diode of FIG. 28. FIG. 31 is a cross-sectional view showing an example of the organic light-emitting diode of FIG. 29.

Referring to FIG. 30, the light-emitting element (e.g., the organic light-emitting diode) may include a first emitting unit EU1, a second emitting unit EU2, and a third emitting unit EU3 stacked on one another in this order. The first charge generation layer CGL1 may be disposed between the first emitting unit EU1 and the second emitting unit EU2, and the second charge generation layer CGL2 may be disposed between the second emitting unit EU2 and the third emitting unit EU3. Each of the first charge generation layer CGL1 and the second charge generation layer CGL2 may include a negative charge generation layer nCGL and a positive charge generation layer pCGL.

The first emitting unit EU1 may include a blue emissive layer BEML. The first emitting unit EU1 may further include a hole injection layer HIL and a hole transport layer HTL between the pixel electrode 201 and the blue emissive layer BEML. According to an embodiment of the present disclosure, a p-doped layer may be further included between the hole injection layer HIL and the hole transport layer HTL. The p-doped layer may be formed by doping the hole injection layer HIL with a p-type doping material. According to an embodiment of the present disclosure, at least one of a blue light auxiliary layer, an electron blocking layer, or a buffer layer may be further included between the blue emissive layer BEML and the hole transport layer HTL. The blue light auxiliary layer may increase the emission efficiency of the blue emissive layer BEML. The blue light auxiliary layer may increase the emission efficiency of the blue emissive layer BEML by adjusting a hole charge balance. The electron blocking layer may be used to prevent or substantially prevent injection of electrons into the hole transport layer HTL. The buffer layer may be used to compensate for a resonance distance according to a wavelength of light emitted from the emissive layer.

The second emitting unit EU2 may include a yellow emissive layer YEML, and a red emissive layer REML directly in contact with the yellow emissive layer YEML under the yellow emissive layer YEML. The second emitting unit EU2 may further include a hole transport layer HTL between the positive charge generation layer pCGL of the first charge generation layer CGL1 and the red emissive layer REML, and an electron transport layer ETL between the yellow emissive layer YEML and the negative charge generation layer nCGL of the second charge generation layer CGL2.

The third emitting unit EU3 may include a blue emissive layer BEML. The third emitting unit EU3 may further include a hole transport layer HTL between the positive charge generation layer pCGL of the second charge generation layer CGL2 and the blue emissive layer BEML. The third emitting unit EU3 may further include an electron transport layer ETL and an electron injection layer EIL between the blue emissive layer BEML and the common electrode 205. The electron transport layer ETL may be made up of a single layer or multiple layers. According to an embodiment of the present disclosure, at least one of a blue light auxiliary layer, an electron blocking layer, or a buffer layer may be further included between the blue emissive layer BEML and the hole transport layer HTL. At least one of the hole blocking layer or the buffer layer may be further included between the blue emissive layer BEML and the electron transport layer ETL. The hole blocking layer may be used to prevent or substantially prevent injection of holes into the electron transport layer ETL.

The light-emitting element (e.g., the organic light-emitting diode) shown in FIG. 31 is the same or substantially the same as (or similar to) the light-emitting element (e.g., the organic light-emitting diode) shown in FIG. 30, except for a stacked structure of a second emitting unit EU2. Referring to FIG. 31, the second emitting unit EU2 may include: a yellow emissive layer YEML; a red emissive layer REML directly in contact with the yellow emissive layer YEML under the yellow emissive layer YEML; and a green emissive layer GEML directly in contact with the yellow emissive layer YEML over the yellow emissive layer YEML. The second emitting unit EU2 may further include a hole transport layer HTL between the positive charge generation layer pCGL of the first charge generation layer CGL1 and the red emissive layer REML, and an electron transport layer ETL between the green emissive layer GEML and the negative charge generation layer nCGL of the second charge generation layer CGL2.

Figure 32:
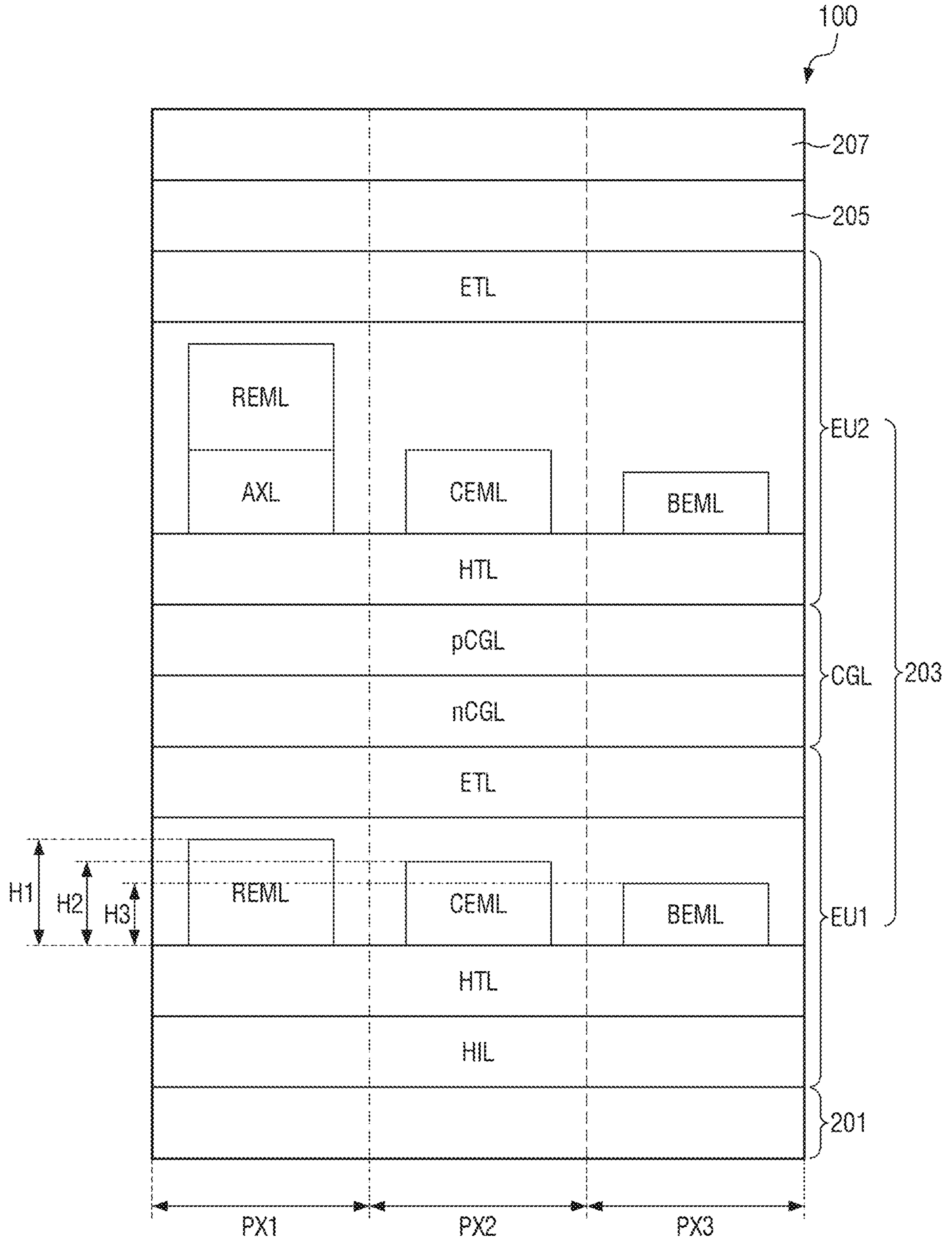
FIG. 32 is a cross-sectional view showing a structure of a pixel of a display device according to an embodiment of the present disclosure.

FIG. 32 is a cross-sectional view showing a structure of a pixel of a display device according to an embodiment of the present disclosure.

Referring to FIG. 32, a display panel 100 of a display device may include a plurality of pixels (e.g., the above-described sub-pixels). The plurality of pixels may include a first pixel PX1, a second pixel PX2, and a third pixel PX3. Each of the first pixel PX1, the second pixel PX2, and the third pixel PX3 may include a pixel electrode 201, a common electrode 205, and an intermediate layer 203. According to an embodiment of the present disclosure, the first pixel PX1 may be a red pixel, the second pixel PX2 may be a green pixel, and the third pixel PX3 may be a blue pixel.

The pixel electrode 201 may be independently disposed in each of the first pixel PX1, the second pixel PX2, and the third pixel PX3.

The intermediate layer 203 of each of the first pixel PX1, the second pixel PX2, and the third pixel PX3 may include a first emitting unit EU1, a second emitting unit EU2, and a charge generation layer CGL between the first emitting unit EU1 and the second emitting unit EU2, which are stacked on one another in this order. The charge generation layer CGL may include a negative charge generation layer nCGL and a positive charge generation layer pCGL. The charge generation layer CGL may be a common layer continuously formed across the first pixel PX1, the second pixel PX2, and the third pixel PX3.

The first emitting unit EU1 of the first pixel PX1 may include a hole injection layer HIL, a hole transport layer HTL, a red emissive layer REML, and an electron transport layer ETL sequentially stacked on the pixel electrode 201. The first emitting unit EU1 of the second pixel PX2 may include a hole injection layer HIL, a hole transport layer HTL, a green emissive layer GEML, and an electron transport layer ETL sequentially stacked on the pixel electrode 201. The first emitting unit EU1 of the third pixel PX3 may include a hole injection layer HIL, a hole transport layer HTL, a blue emissive layer BEML, and an electron transport layer ETL sequentially stacked on the pixel electrode 201. Each of the hole injection layer HIL, the hole transport layer HTL, and the electron transport layer ETL of the first emitting units EU1 may be a common layer extended across the first pixel PX1, the second pixel PX2, and the third pixel PX3.

The second emitting unit EU2 of the first pixel PX1 may include a hole transport layer HTL, an auxiliary layer AXL, a red emissive layer REML, and an electron transport layer ETL sequentially stacked on the charge generation layer CGL. The second emitting unit EU2 of the second pixel PX1 may include a hole transport layer HTL, a green emissive layer GEML, and an electron transport layer ETL sequentially stacked on the charge generation layer CGL. The second emitting unit EU2 of the third pixel PX3 may include a hole transport layer HTL, a blue emissive layer BEML, and an electron transport layer ETL sequentially stacked on the charge generation layer CGL. Each of the hole transport layer HTL and the electron transport layer ETL of the second emitting units EU2 may be a common layer extended across the first pixel PX1, the second pixel PX2, and the third pixel PX3. According to an embodiment of the present disclosure, at least one of a hole blocking layer or a buffer layer may be formed between the emissive layer and the electron transport layer ETL in the second emitting units EU2 of the first pixel PX1, the second pixel PX2, and the third pixel PX3.

A thickness H1 of the red emissive layer REML, a thickness H2 of the green emissive layer GEML, and a thickness H3 of the blue emissive layer BEML may be determined depending on the resonance distance. The auxiliary layer AXL may be additionally disposed to adjust the resonance distance, and may include a suitable material for adjusting the resonance. For example, the auxiliary layer AXL may include the same material as that of the hole transport layer HTL.

Although the auxiliary layer AXL is disposed only in the first pixel PX1 in the example shown in FIG. 32, the present disclosure is not limited thereto. For example, the auxiliary layer AXL may be disposed in at least one of the first pixel PX1, the second pixel PX2, or the third pixel PX3, in order to match the resonance distance of each of the first pixel PX1, the second pixel PX2, and the third pixel PX3.

The display panel of the display device 1 may further include a capping layer 207 disposed outside (e.g., over) the common electrode 205. The capping layer 207 may be used to improve the emission efficiency by a principle of constructive interference. Accordingly, an out-coupling efficiency of the light-emitting element (e.g., the organic light-emitting diode) may be increased, and thus, the emission efficiency of the light-emitting element (e.g., the organic light-emitting diode) may be improved.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a substrate;
a pixel electrode on the substrate;
a bank on the pixel electrode, and defining an emission area;
a first transistor connected to the pixel electrode; and
a driving electrode connected to the first transistor, and extending in a direction, the driving electrode comprising:
a main electrode extended in the direction; and
a sub-electrode branching off from the main electrode, and extending to have a greatest length that is parallel to the main electrode,
wherein at least one of the main electrode or the sub-electrode overlaps with the emission area to divide the emission area into at least two sub-emission areas in a plan view.

2. The display device of claim 1, wherein a gap is located between the main electrode and the sub-electrode to overlap with the emission area.

3. The display device of claim 2, wherein an edge of the bank defining the emission area overlaps with the gap.

4. The display device of claim 3, further comprising a second transistor connected to the first transistor, and comprising an oxide-based active layer.

5. The display device of claim 4, further comprising a third transistor connected to the second transistor, and comprising an oxide-based active layer.

6. The display device of claim 5, wherein the sub-electrode overlaps with at least one of the second transistor or the third transistor.

7. The display device of claim 1, further comprising a data line adjacent to the driving electrode, and located at the same layer as that of the driving electrode.

8. The display device of claim 7, further comprising a gate connection electrode connected to a gate electrode of the first transistor, and located under the driving electrode.

9. The display device of claim 7, wherein the data line overlaps with the emission area.

10. The display device of claim 9, wherein the emission area comprises a plurality of sub-emission areas divided by at least one of the main electrode or the sub-electrode, and divided by the data line in a plan view.

11. The display device of claim 1, wherein a gap is located between the main electrode and the sub-electrode, and has a U shape.

12. The display device of claim 1, further comprising a first driving voltage line connected to the driving electrode.

13. The display device of claim 1, wherein the emission area is located between adjacent transmissive areas.

14. The display device of claim 13, further comprising an electronic component under the substrate, and overlapping with the emission area and the transmissive areas.

15. The display device of claim 14, further comprising a light-blocking layer on the substrate, and overlapping with the emission area.

16. The display device of claim 15, wherein the light-blocking layer does not overlap with the transmissive areas.

17. A display device comprising:
a substrate;
a pixel electrode on the substrate;
a bank on the pixel electrode, and defining an emission area;
a first transistor connected to the pixel electrode;
a driving electrode connected to the first transistor, and comprising:
a main electrode extended in a direction; and
a sub-electrode branching off from the main electrode;
a data line adjacent to the driving electrode, and located at the same layer as that of the driving electrode;
a gate connection electrode connected to a gate electrode of the first transistor, and located under the driving electrode; and
an initialization voltage line adjacent to the gate connection electrode, and located at the same layer as that of the gate connection electrode,
wherein at least one of the main electrode or the sub-electrode overlaps with the emission area to divide the emission area into at least two sub-emission areas in a plan view.

18. The display device of claim 17, wherein at least a part of the initialization voltage line is located between the data line and the gate connection electrode in a plan view.

19. A display device comprising:
a substrate;
a pixel electrode on the substrate;
a bank on the pixel electrode, and defining an emission area;
a first transistor connected to the pixel electrode;
a driving electrode connected to the first transistor, and comprising:
a main electrode extended in a direction; and
a sub-electrode branching off from the main electrode;
a data line adjacent to the driving electrode, and located at the same layer as that of the driving electrode; and
a gate connection electrode connected to a gate electrode of the first transistor, and located under the driving electrode,
wherein at least one of the main electrode or the sub-electrode overlaps with the emission area to divide the emission area into at least two sub-emission areas in a plan view, and
wherein the gate connection electrode overlaps with the main electrode of the driving electrode.

* * * * *